(12) United States Patent
Onoue

(10) Patent No.: US 12,507,580 B2
(45) Date of Patent: Dec. 23, 2025

(54) DISPLAY DEVICE AND METHOD FOR MANUFACTURING THE SAME

(71) Applicant: Samsung Display Co., LTD., Yongin-si (KR)

(72) Inventor: Shinya Onoue, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 442 days.

(21) Appl. No.: 17/970,383

(22) Filed: Oct. 20, 2022

(65) Prior Publication Data
US 2023/0320187 A1  Oct. 5, 2023

(30) Foreign Application Priority Data

Apr. 1, 2022 (KR) .................. 10-2022-0041257

(51) Int. Cl.
*H10K 59/80* (2023.01)
*H10K 71/00* (2023.01)
*H10K 77/10* (2023.01)
*H10K 102/00* (2023.01)

(52) U.S. Cl.
CPC ..... *H10K 59/8794* (2023.02); *H10K 59/8792* (2023.02); *H10K 71/00* (2023.02); *H10K 77/111* (2023.02); *H10K 71/821* (2023.02); *H10K 2102/311* (2023.02)

(58) Field of Classification Search
CPC .... H10K 77/111; H10K 50/865; H10K 50/87; H10K 71/00; H10K 71/821; H10K 2102/311; H10K 59/126; H10K 59/8794; G02B 5/20; G02B 5/22; H10H 29/142; H10D 86/481; H10D 86/60; G06F 1/1641; G09F 9/301
See application file for complete search history.

(56) References Cited

U.S. PATENT DOCUMENTS

| | | | |
|---|---|---|---|
| 10,211,421 B2 * | 2/2019 | Lee .................. | H10K 50/84 |
| 10,854,828 B2 * | 12/2020 | Furuie ............... | H10K 50/818 |
| 12,075,646 B2 | 8/2024 | Kim | |
| 2018/0366663 A1 * | 12/2018 | Furuie ............... | H10K 50/818 |
| 2020/0194712 A1 * | 6/2020 | Choi ................ | H10K 59/8794 |
| 2021/0226177 A1 * | 7/2021 | Xu ................... | G02F 1/133305 |
| 2022/0259469 A1 * | 8/2022 | Leone ............... | C09J 5/00 |

FOREIGN PATENT DOCUMENTS

| | | |
|---|---|---|
| KR | 10-2007-0101602 A | 10/2007 |
| KR | 10-2008-0019841 A | 3/2008 |
| KR | 10-2012-0122534 A | 11/2012 |
| KR | 10-2014-0055648 A | 5/2014 |

(Continued)

*Primary Examiner* — J. E. Schoenholtz
(74) *Attorney, Agent, or Firm* — Womble Bond Dickinson (US) LLP

(57) ABSTRACT

A display device includes: a display panel having one face, and another face opposite to the one face; a functional layer on the one face of the display panel, and including a light-blocking material; and a display driving substrate on the other face of the display panel, and electrically connected to the display panel. The functional layer includes a first portion in contact with the display driving substrate, and a second portion spaced from the display driving substrate, and a hardness of the first portion is greater than a hardness of the second portion.

20 Claims, 24 Drawing Sheets

(56) References Cited

FOREIGN PATENT DOCUMENTS

| | | |
|---|---|---|
| KR | 10-2018-0008965 A | 1/2018 |
| KR | 10-2018362 B1 | 9/2019 |
| KR | 10-2047920 B1 | 11/2019 |
| KR | 10-2020-0066416 A | 6/2020 |
| KR | 10-2020-0083775 A | 7/2020 |
| KR | 10-2020-0120996 A | 10/2020 |

\* cited by examiner

DISPLAY DEVICE AND METHOD FOR MANUFACTURING THE SAME

CROSS-REFERENCE TO RELATED APPLICATION

This application claims priority to and the benefit of Korean Patent Application No. 10-2022-0041257, filed on Apr. 1, 2022 in the Korean Intellectual Property Office, the entire content of which is incorporated by reference herein.

BACKGROUND

1. Field

Aspects of embodiments of the present disclosure relate to a display device, and a method for manufacturing the display device.

2. Description of Related Art

Recently, in the development of display device technology, a flexible display panel that is foldable or rollable is being developed. A display device including the flexible display panel may be transformed into a preset shape, or may be transformed into various suitable shapes according to a user's request.

The flexible display device includes a flexible display panel, and various functional members. The flexible display panel may include a base member, various functional layers disposed on the base member, and pixels disposed on the base member.

The above information disclosed in this Background section is for enhancement of understanding of the background of the present disclosure, and therefore, it may contain information that does not constitute prior art.

SUMMARY

A cover panel including various functional layers may be disposed on a rear face of the flexible display panel. The various functional layers may perform a heat dissipation function, an electromagnetic wave shielding function, a pattern visibility prevention function, a grounding function, a shock-absorbing function, a strength reinforcement function, a digitizing function, and/or the like.

One or more embodiments of the present disclosure are directed to a display device including a cover panel, in which a light-blocking layer and an impact absorbing layer are integrated into one layer in a direct application scheme, thereby reducing the number of films used in manufacturing the cover panel, such that a cover panel formation process may be simplified, and manufacturing costs of the display device may be reduced.

One or more embodiments of the present disclosure are directed to a method of manufacturing the display device including the cover panel.

However, the aspects and features of the present disclosure are not limited to those described above. The above and other aspects and features of the present disclosure may be more clearly understood based on following description, or may be realized by practicing one or more of the presented embodiments of the present disclosure.

According to one or more embodiments of the present disclosure, a display device includes: a display panel having one face, and another face opposite to the one face; a functional layer on the one face of the display panel, and including a light-blocking material; and a display driving substrate on the other face of the display panel, and electrically connected to the display panel. The functional layer includes a first portion in contact with the display driving substrate, and a second portion spaced from the display driving substrate, and a hardness of the first portion is greater than a hardness of the second portion.

In an embodiment, the display panel may include: a main area in contact with the functional layer, a sub-area facing away from the main area, and spaced from the functional layer, and a bent area between the main area and the sub-area. The display panel may be bent at the bent area. The display device may further include a step-compensation member between the functional layer and the sub-area of the display panel, and in contact with the functional layer and the sub-area of the display panel. The functional layer may further include a third portion contacting the step-compensation member, and a fourth portion spaced from the step-compensation member. A hardness of the third portion may be greater than the hardness of the second portion and a hardness of the fourth portion.

In an embodiment, the third portion may be spaced from the first portion with the second portion interposed therebetween, and the fourth portion may be spaced from the second portion with the third portion interposed therebetween.

In an embodiment, the display device may further include: a heat-dissipation layer between the functional layer and the step-compensation member.

In an embodiment, the step-compensation member may include: a first adhesive member; a second adhesive member; and a base member between the first adhesive member and the second adhesive member, and the first adhesive member may be in contact with the heat-dissipation layer, while the second adhesive member may be in contact with the sub-area of the display panel.

In an embodiment, each of the second portion and the fourth portion may include elastomer particles including a light-blocking material, and/or hollow particles including a light-blocking material.

In an embodiment, a diameter of each of the elastomer particles and/or the hollow particles may be in a range of 100 nm to 5 μm.

In an embodiment, each of the elastomer particles and/or the hollow particles may not overlap with the step-compensation member.

In an embodiment, the functional layer may have a thickness in a range of 20 μm to 140 μm.

In an embodiment, each of the first portion, the second portion, the third portion, and the fourth portion may include at least one organic material from among a (meth)acrylate-based organic material or a monofunctional (meth)acrylate-based organic material, and a composition of the organic material contained in each of the first portion and the third portion may be different from a composition of the organic material contained in each of the second portion and the fourth portion.

According to one or more embodiments of the present disclosure, a display device includes: a display panel having one face, and another face opposite to the one face; and a functional layer on the one face of the display panel, and including a light-blocking material. The functional layer includes: a first portion having a first base, and at least two first protrusions on the first base; a second portion having a second base, and a planar portion on the second base; and a third portion having a third base, and at least two second protrusions on the third base. The first protrusions are spaced from each other, the second protrusions are spaced from each other, and a hardness of the second portion is greater than a hardness of the first portion and a hardness of the third portion.

In an embodiment, the planar portion may include one side face adjacent to the first portion, and another side face opposite the one side face and adjacent to the third portion, the one side face of the planar portion may face a first protrusion from among the at least two first protrusions, and the other side face of the planar portion may face a second protrusion from among the at least two second protrusions.

In an embodiment, the first base and the first protrusions may be integral with each other, the second base and the planar portion may be integral with each other, and the third base and the second protrusions may be integral with each other.

In an embodiment, at least two of a sum of a dimension in a thickness direction of the first base and a dimension in the thickness direction of a first protrusion from among the first protrusions, a sum of a dimension in the thickness direction of the second base and a dimension in the thickness direction of the planar portion, and a sum of a dimension in the thickness direction of the third base and a dimension in the thickness direction of a second protrusion from among the second protrusions may be equal to each other.'

In an embodiment, the display device may further include: a step-compensation member including: a first adhesive member; a second adhesive member; and a base member between the first adhesive member and the second adhesive member. The step-compensation member may be on one face of the second portion, and the step-compensation member may overlap with the second portion in a thickness direction of the display device.

In an embodiment, each of the first portion and the third portion may include elastomer particles including a light-blocking material, and/or hollow particles including a light-blocking material.

In an embodiment, each of the first protrusions and the second protrusions may protrude in a direction away from the one face of the display panel.

In an embodiment, an optical density of the functional layer may be in a range of 3 to 4.

According to one or more embodiments of the present disclosure, a method for manufacturing a display device, includes: providing a display panel having a first area, a second area, a third area between the first area and the second area, and a fourth area spaced from the third area with the second area therebetween; applying a first organic material including peroxide on the first area and the second area, and applying a second organic material including a reducing agent on the first organic material to form a first portion and a second portion of a functional layer by mixing and a curing reaction between the first organic material and the second organic material; and applying a third organic material including peroxide on the third area and the fourth area, and applying a fourth organic material including a reducing agent on the third organic material to form a third portion and a fourth portion of the functional layer by mixing and a curing reaction between the third organic material and the fourth organic material. The third organic material has a different composition from a composition of the first organic material, and the fourth organic material has a different composition from a composition of the second organic material.

In an embodiment, the method may further include: forming protrusions on each of the first portion and the second portion.

According one or more embodiments of the present disclosure, manufacturing costs of the display device may be reduced by simplifying a manufacturing process of the display device.

However, the aspects and features of the present disclosure are not limited to those described above, and various other aspects and features may be included in the present disclosure.

BRIEF DESCRIPTION OF DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
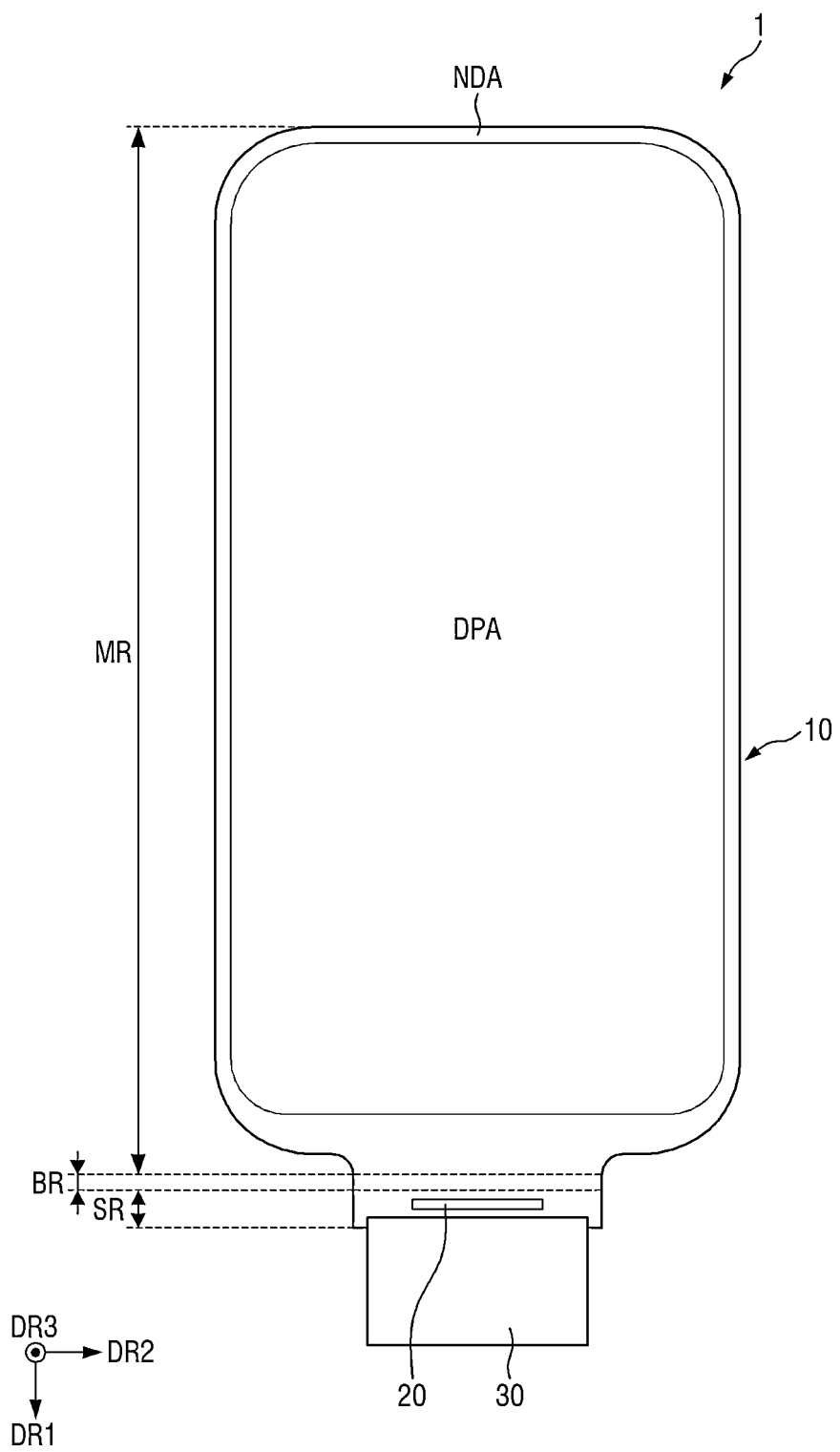
FIG. 1 is a plan view of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order, function, or operation specified in a block may be different from the described order. For example, two consecutively described processes may be performed at the same or substantially at the same time, or may be performed in an order opposite to the described order.

A shape, a size, a percentage, an angle, a number, and the like described in the drawings illustrating embodiments of the present disclosure are illustrative, and the present disclosure is not limited thereto. In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, temporal relationships, for example, such as temporal precedent relationships between two events, such as "after", "subsequent to", "before", and the like, another event may occur therebetween unless "directly after", "directly subsequent" or "directly before" is indicated. The features of the various embodiments of the disclosure may be partially or entirely combined with each other, and may be technically associated with each other or operate with each other. The embodiments may be implemented independently of each other or may be implemented together in an association relationship.

In the figures, a first direction DR1, a second direction DR2, and the third direction DR3 indicate directions that extend in different directions from each other. The first direction DR1, the second direction DR2, and the third direction DR3 may cross (e.g., intersect) each other in a perpendicular or substantially perpendicular manner. For example, the first direction DR1 may be a horizontal direction, the second direction DR2 may be a vertical direction in a plan view, and the third direction DR3 may be a thickness direction in a cross-sectional view. Each of the first direction DR1, the second direction DR2, and/or the third direction DR3 may include two or more directions. For example, in the cross-sectional view, the third direction DR3 may include an upward direction and a downward direction. In this case, one face of a member disposed to face in the upward direction may be referred to as a top face, and the other face of the member disposed to face in the downward direction may be referred to as a bottom face. However, the directions are illustrative and are relative concepts, and thus, are not limited thereto.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
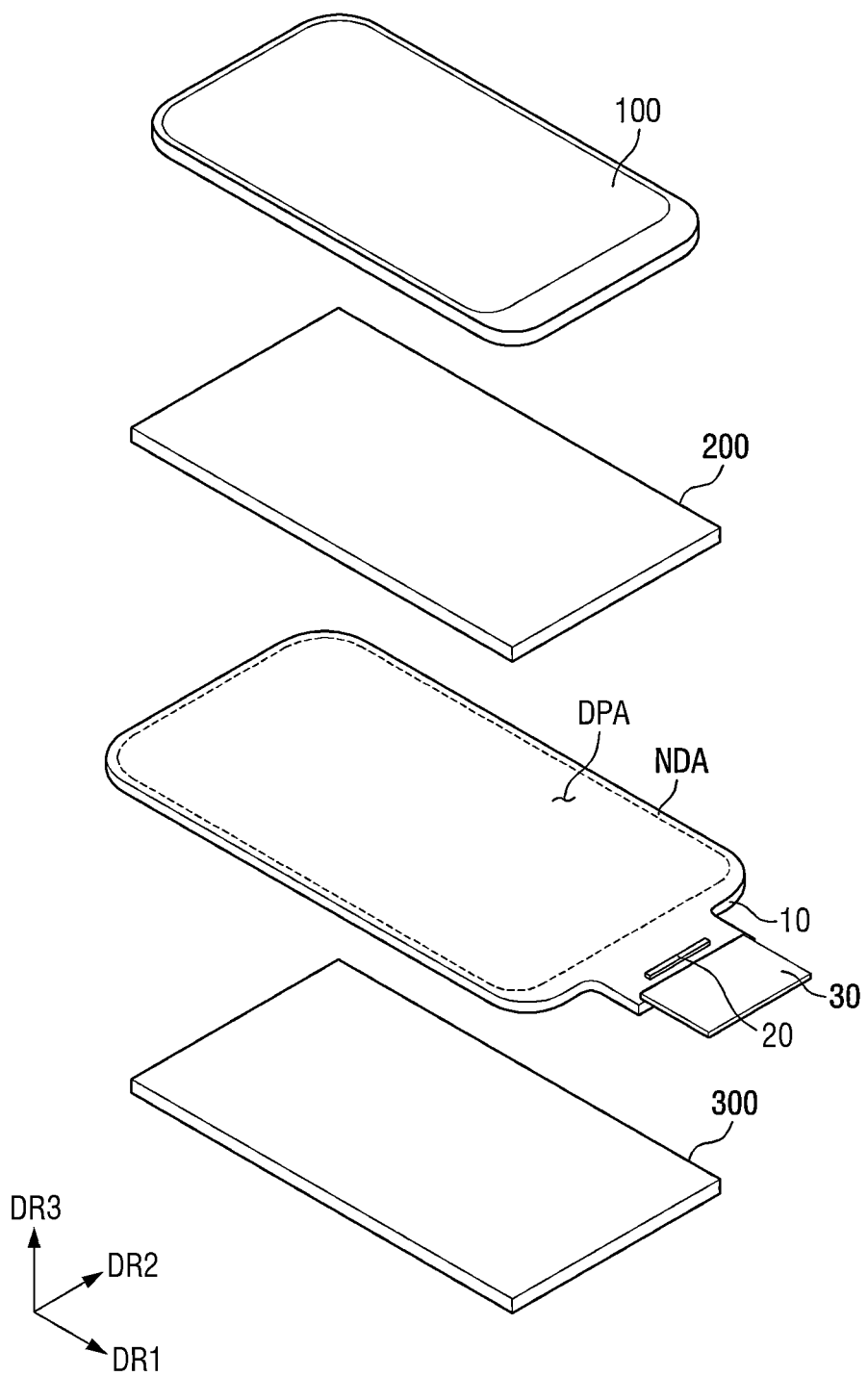
FIG. 2 is an exploded perspective view of a display device according to an embodiment.
Figure 3:
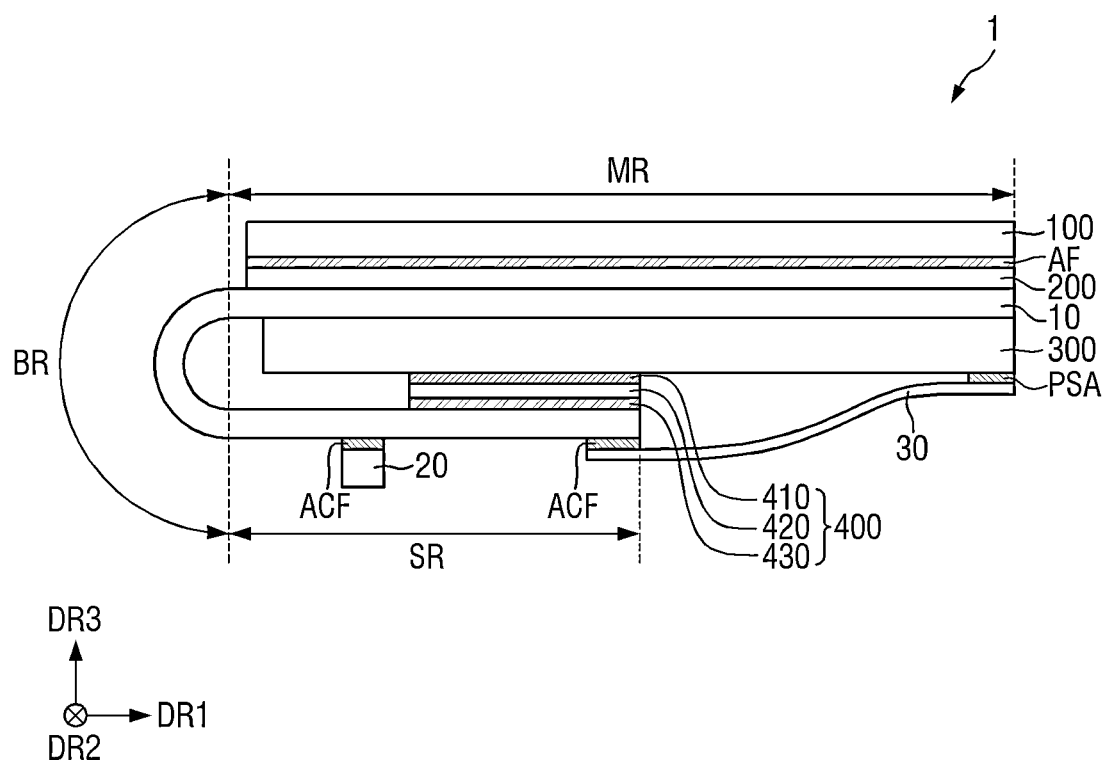
FIG. 3 is a cross-sectional view of a display device according to an embodiment.
Figure 4:
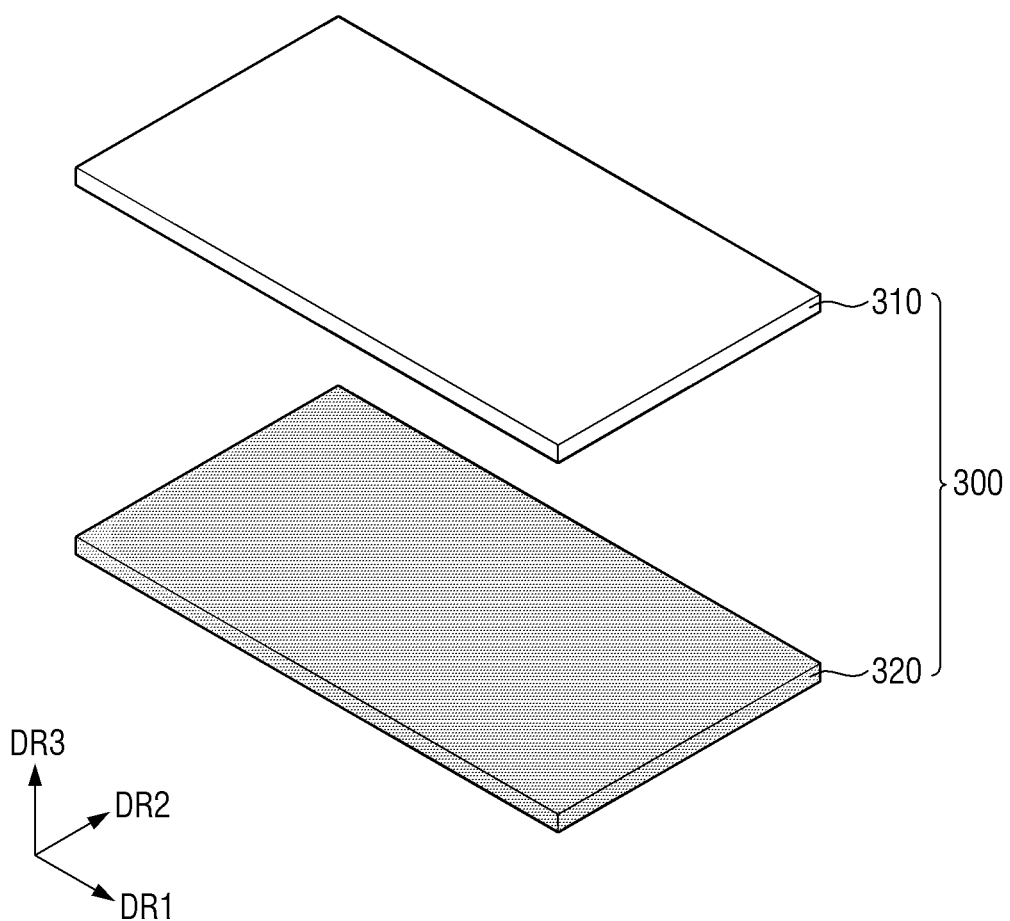
FIG. 4 is an exploded perspective view of a cover panel according to an embodiment.

FIG. 1 is a plan view of a display device according to an embodiment. FIG. 2 is an exploded perspective view of a display device according to an embodiment. FIG. 3 is a cross-sectional view of a display device according to an embodiment. FIG. 4 is an exploded perspective view of a cover panel.

Referring to FIG. 1 and FIG. 2, a display device 1 according to an embodiment displays a moving image and/or a still image. The display device 1 according to an embodiment may be applied to a portable electronic device, such as a mobile phone, a smart phone, a tablet PC (e.g., a tablet personal computer), a mobile communication terminal, an electronic notebook, an electronic book, a PMP (e.g., a portable multimedia player), a navigation device, an UMPC (e.g., an Ultra Mobile PC), and/or the like. As another example, the display device 1 according to an embodiment may be applied as a display unit (e.g., a display) of a television, a laptop computer, a monitor, a billboard, or an Internet of Things (IoT) device.

In FIG. 1, a direction parallel to or substantially parallel to a first side (e.g., a vertical side) of the display device 1 is defined as the first direction DR1, a direction parallel to or substantially parallel to a second side (e.g., a horizontal side) of the display device 1 is defined as the second direction DR2, and a thickness direction of the display device 1 is defined as the third direction DR3.

The display panel 10 includes (e.g., displays) a screen. Any suitable kind of a display panel, such as an organic light-emitting display panel including an organic light-emitting layer, a micro light-emitting diode display panel using a micro LED, a quantum dot light-emitting display panel using a quantum dot light-emitting diode including a quantum dot light-emitting layer, or an inorganic light-emitting display panel using an inorganic light-emitting element including an inorganic semiconductor, may be applied to the display panel according to an embodiment. Hereinafter, for convenience, the display panel 10 of the display device 1 will be described in more detail in the context of the organic light-emitting display panel. The display panel 10 may include (e.g., may display) the screen toward one side in the third direction DR3.

The display panel 10 may include a flexible substrate made of a flexible polymer material, such as polyimide (PI). Accordingly, the display panel 10 may be flexible, so as to be partially bendable, foldable, and/or rollable in a corresponding manner to various platforms (e.g., rollable, slidable, and foldable platforms) of the display device 1.

Referring to FIG. 1, the display panel 10 may include a main area MR, and a bent area BR connected to one side of the main area MR. The display panel 10 may further include a sub-area SR connected to the bent area BR, and overlapping with the main area MR in the thickness direction of the device when the bent area BR is bent.

When a portion of the display panel 10 including (e.g., displaying) the screen is defined as a display area DPA, and a portion of the display panel 10 not including (e.g., displaying) the screen is defined as a non-display area NDA, the display area DPA of the display panel 10 may be disposed at (e.g., in or on) the main area MR. A remaining portion of the display panel 10, except for the display area DPA, may be the non-display area NDA of the display panel 10. In an embodiment, a peripheral edge portion around (e.g., surrounding) the display area DPA at (e.g., in or on) the main area MR, an entirety of the bent area BR, and an entirety of the sub-area SR may constitute the non-display area NDA. However, the present disclosure is not limited thereto. The bent area BR and/or the sub-area SR may include the display area DPA.

The main area MR may have a shape that is the same or substantially the same as (or similar to) a shape of an outline of the display device 1 in a plan view. The main area MR may be a flat or substantially flat area disposed in one plane. However, the present disclosure is not limited thereto. At least one edge (e.g., side), except for an edge connected to the bent area BR, from among the edges of the main area MR may be bent to form a curved face, or may be bent in a vertical direction.

The display area DPA of the display panel 10 may be disposed at (e.g., in or on) an inner region of the main area MR. The display area DPA may include a plurality of pixels. Each of the pixels may include a light-emitting layer, and a circuit layer for controlling an amount of light emitted from the light-emitting layer. The circuit layer may include a display line, a display electrode, and at least one transistor. The light-emitting layer may include an organic light-emitting material. The light-emitting layer may be sealed with an encapsulation film. A configuration of each of the pixels will be described in more detail below.

The display area DPA may have a rectangular shape with right angled corners, or a rectangular shape with rounded corners. However, the present disclosure is not limited thereto, and the display area DPA may have various suitable shapes, such as a square, another polygon, a circle, or an oval.

When at least one edge, except for the edge connected to the bent area BR, from among the edges of the main area MR has a curved surface or is bent, the display area DPA may also be disposed at (e.g., in or on) the at least one edge. However, the present disclosure is not limited thereto, and the non-display area NDA that does not include (e.g., that does not display) the screen may be disposed at (e.g., in or on) the curved or bent edge, or both the display area DPA and the non-display area NDA may be disposed at (e.g., in or on) the curved or bent edge.

The non-display area NDA may be disposed around (e.g., to surround around a periphery of) the display area DPA at (e.g., in or on) the main area MR. The non-display area NDA of the main area MR may extend from an outer boundary of the display area DPA to an outer edge of the display panel 10. A signal line and/or driving circuits for applying a signal to the display area DPA may be disposed at (e.g., in or on) the non-display area NDA of the main area MR.

The bent area BR is connected to the main area MR. For example, the bent area BR may be connected to one end of the main area MR. A width of the bent area BR may be smaller than a width (e.g., a dimension of a short side) of the main area MR. A connection portion between the main area MR and the bent area BR may have an L-shaped cut shape.

In the bent area BR, display panel 10 may be bent at a curvature in a downward direction, or in other words, in an opposite direction of a display face. The bent area BR may have a constant or substantially constant radius of curvature. However, the present disclosure is not limited thereto. The bent area may have different radii of curvature in different sections thereof. As the display panel 10 is bent at the bent area BR, a face of the display panel 10 is reversed. In other words, as the display panel 10 is bent at the bent area BR, one face of the display panel 10 facing upwardly may be changed so as to face outwardly and then downwardly.

The sub-area SR extends from the bent area BR. The sub-area SR may extend in a direction parallel to or substantially parallel to the main area MR after the bending of the bent area BR is completed. The sub-area SR may overlap with the main area MR in the thickness direction of the display panel 10. The sub-area SR may overlap with the non-display area NDA at an edge area of the main area MR, and may further overlap with a portion of the display area DPA of the main area MR.

In an embodiment, a width of the sub-area SR may be smaller than a width of the bent area BR. However, the present disclosure is not limited thereto. In some embodiments, the width of the sub-area SR may be the same or substantially the same as the width of the bent area BR.

Referring to FIG. 1 to FIG. 3, a driver chip 20 may be disposed on the display panel 10 at (e.g., in or on) the sub-area SR. The driver chip 20 may include an integrated circuit that drives the display panel 10. In an embodiment, the integrated circuit may be embodied as a data driver integrated circuit that generates and provides a data signal. However, the present disclosure is not limited thereto.

The driver chip 20 may be mounted on the display panel 10 at (e.g., in or on) the sub-area SR. The driver chip 20 is mounted on one face of the display panel 10 that is coplanar with the display face thereof before the display panel 10 is bent. As described above, the bent area BR is bent, and thus, the one face of the display panel is reversed. Thus, the driver chip 20 mounted on the one face of the display panel 10 that faces upwards in the thickness direction may be displaced, such that a top face of the driver chip 20 including the one face faces downwards.

A width of the driver chip 20 in a horizontal direction (e.g., in the second direction DR2) may be smaller than a width of the display panel 10 in the horizontal direction. The driver chip 20 may be disposed at (e.g., in or on) a center of the sub-area SR in the horizontal direction. A left edge and a right edge of the driver chip 20 may be spaced apart from a left edge and a right edge of the sub-area SR, respectively.

A pad is disposed at an end of the sub-area SR of the display panel 10. A display driving substrate 30 may be connected to the pad. The display driving substrate may be embodied as a flexible printed circuit board or film.

The driver chip 20 and the display driving substrate 30 may be attached to the display panel 10 via an anisotropic conductive film (ACF), or may be attached to the display panel 10 via ultrasonic bonding.

A plurality of signal lines may be disposed at (e.g., in or on) the sub-area SR, the bent area BR, and the main area MR. The signal lines may extend from the sub-area SR through the bent area BR to the main area MR.

Referring to FIG. 2 to FIG. 4, the display device 1 according to an embodiment may include the display panel 10, a window member 100, an anti-reflection member 200, a cover panel 300, and a step-compensation member 400.

The display panel 10 includes one face (e.g., hereinafter, a "front face") facing in the third direction DR3, and another face (e.g., hereinafter, a "rear face") opposite to the one face. The anti-reflection member 200, an adhesive layer AF, and the window member 100 may be sequentially stacked on the front face of the display panel 10, while the cover panel 300 and the step-compensation member 400 may be sequentially stacked on the rear face of the display panel 10.

The window member 100 may protect the display panel 10 from the outside. The window member 100 may be disposed on the front face of the display panel 10. The window member 100 may be made of a transparent material, and may include, for example, glass or plastic. In more detail, the window member 100 may be embodied as ultra-thin-film glass or a transparent polyimide film having a thickness of 0.1 mm or smaller. The window member 100 may be attached onto the front face of the anti-reflection member 200, which will be described in more detail below, via the adhesive layer AF.

The adhesive layer AF may include an OCA (e.g., an Optically Clear Adhesive) film. However, the adhesive layer AF is not limited thereto, and the adhesive layer AF may include a general adhesive. For example, the adhesive layer AF may include an OCR (e.g., an optically clear resin) film or a PSA (e.g., a pressure sensitive adhesive) film.

The anti-reflection member 200 may be disposed on the front face of the display panel 10. The anti-reflection member 200 may reduce a reflectance of external light incident thereto from a front face of the window member 100. The anti-reflection member 200 according to an embodiment may include a phase retarder and a polarizer. The phase retarder may be of a film type or a liquid crystal coating type, and may include a $\lambda/2$ phase retarder and/or a $\lambda/4$ phase retarder. The polarizer may also be of a film type or a liquid crystal coating type. The film type polarizer may include a stretched synthetic resin film. The liquid crystal coating type polarizer may include liquid crystals aligned in a suitable direction (e.g., a predetermined direction). The phase retarder and the polarizer may be implemented into a single polarizing film. However, the present disclosure is not limited thereto. In some embodiments, the anti-reflection member 200 may further include a protective film disposed on a top face or a bottom face of the polarizing film.

Referring to FIG. 3 and FIG. 4, in an embodiment, the cover panel 300 may be disposed on the rear face of the display panel 10. The cover panel 300 may serve to support the display panel 10, and may protect the display panel 10. In more detail, the cover panel 300 may include a functional layer 310 for performing both a light-blocking function for absorbing light incident thereto from the outside, and a shock-absorbing function for absorbing a shock from the outside, and a heat-dissipation layer 320 for effectively discharging heat from the display panel 10 to the outside. However, the present disclosure is not limited thereto. In some embodiments, the cover panel 300 may further include one or more layers having other suitable functions, in addition to the functional layer 310 and the heat-dissipation layer 320. For example, the cover panel 300 may further include one or more layers having an electromagnetic wave shielding function, a pattern viewing prevention function, a grounding function, a reinforcement function, and/or a digitizing function.

The functional layer 310 and the heat-dissipation layer 320 included in the cover panel 300 will be described in more detail below with reference to FIG. 5 through FIG. 12.

The step-compensation member 400 may be disposed in a space between the display panel 10 and the cover panel 300 at (e.g., in or on) the sub-area SR.

In more detail, the display panel 10 may be bent to have a 'C' or 'U' shape in a cross section (e.g., in a cross-sectional view). In a state in which the display panel 10 is bent, a rear face of the display panel 10 at (e.g., in or on) the sub-area SR may face a rear face of the cover panel 300, while a space is defined therebetween. The step-compensation member 400 may be disposed in the space between the display panel and the cover panel 300 at (e.g., in or on) the sub-area SR when the display panel is in the bent state.

The step-compensation member 400 may include a first adhesive member 410, a base member 420, and a second adhesive member 430.

The base member 420 may include a material having flexibility and durability, for example, such as polyethylene terephthalate (PET), polycarbonate (PC), thermoplastic polyurethane (TPU), polystyrene latex (PSL), and/or the like. However, the present disclosure is not limited thereto. In some embodiments, the base member 420 may include an organic/inorganic composite material, or may include a porous organic layer and an inorganic material filling pores of the porous organic layer.

Because the step-compensation member 400 includes the first adhesive member 410 disposed on a front face of the base member 420, and the second adhesive member 430 disposed on a rear face of the base member 400, both the front face and the rear face of the step-compensation member 400 may have an adhesive ability.

Each of the first adhesive member 410 and the second adhesive member 430 may be embodied as a strip, such as a double-sided tape, or may be embodied as a pressure sensitive adhesive (PSA). However, the present disclosure is not limited thereto. In some embodiments, each of the first adhesive member 410 and the second adhesive member 430 may include a silicone-based adhesive, or an acrylic adhesive. However, each of the first adhesive member 410 and the second adhesive member 430 is not limited to the above-described examples, and may have other suitable compositions of adhesive materials as known by those having ordinary skill in the art.

In an embodiment, each of the first adhesive member 410 and the second adhesive member 430 may be disposed to cover at least a portion of the base member 420. The first adhesive member 410 may attach the base member 420 and the cover panel 300 to each other, and the second adhesive member 430 may attach the base member 420 and the display panel 10 to each other.

Therefore, the step-compensation member 400 may be fixedly disposed in the space between the display panel 10 and the cover panel 300 at (e.g., in or on) the sub-area SR via the first adhesive member 410 and the second adhesive member 430 in a state in which the display panel 10 is bent. The base member 420 disposed between the first adhesive member 410 and the second adhesive member 430 may be made of a material having flexibility and durability. Thus, the step-compensation member 400 may perform a cushioning function against external impacts.

Further, the step-compensation member 400 has a suitable thickness (e.g., a predetermined thickness) in the third direction DR3, and is disposed in the space between display panel 10 and the cover panel 300 at (e.g., in or on) the sub-area SR in a state in which the display panel 10 is bent. Thus, the step-compensation member 400 may compensate for a step in the space between the cover panel 300 and the display panel 10 in a state in which the display panel 10 is bent.

The display driving substrate 30 may be disposed on a portion of the display panel 10 disposed at (e.g., in or on) the sub-area SR. In other words, in the state in which the display panel 10 is bent, one end of the display driving substrate 30 may be in contact with a rear face of the cover panel 300, while another end of the display driving substrate 30 may contact a front face of the portion of the display panel 10 disposed at (e.g., in or on) the sub-area SR.

For example, one end of the display driving substrate 30 may be in contact with the rear face of the cover panel 300 via a third adhesive member PSA, while the other end of the display driving substrate 30 may be in contact with, and be electrically connected to, the front face of the display panel 10 via an anisotropic conductive film (ACF).

In an embodiment, the third adhesive member PSA may be embodied as a pressure-sensitive adhesive film. However, the present disclosure is not limited thereto.

Figure 5:
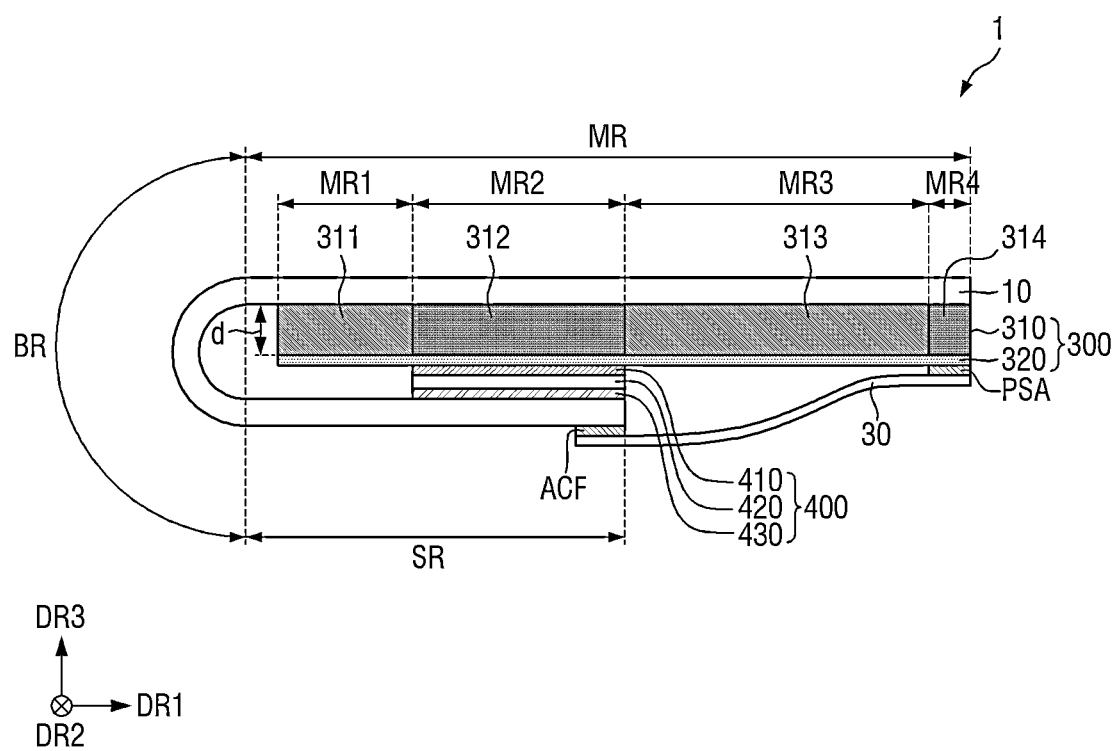
FIG. 5 is a schematic cross-sectional view of a display device according to an embodiment.

FIG. 5 is a schematic cross-sectional view of a display device according to an embodiment.

In FIG. 5, for convenience of illustration, the window member 100, the adhesive layer AF, the anti-reflection member 200, and the driver chip 20 disposed on the display panel 10 are not shown.

Referring to FIG. 5, as described above, in the display device 1 according to an embodiment, the cover panel 300 disposed on the rear face of the display panel 10 may include the functional layer 310 and the heat-dissipation layer 320.

The functional layer 310 is disposed on the rear face of the display panel 10 at (e.g., in or on) the main area MR, but may not be disposed at (e.g., in or on) the bent area BR and the sub-area SR of the display panel 10.

In more detail, the main area MR of the display panel 10 includes a first main area MR1, a second main area MR2, a third main area MR3, and a fourth main area MR4. Lengths in the first direction DR1 of the first main area MR1, the second main area MR2, the third main area MR3, and the fourth main area MR4 included in the main area MR of the display panel 10 may be different from each other. For example, the length in the first direction DR1 of the second main area MR2 may be larger than the length in the first direction DR1 of each of the first main area MR1 and the fourth main area MR4. The length in the first direction DR1 of the third main area MR3 may be larger than the length in the first direction DR1 of each of the first main area MR1 and the second main area MR2. However, the present disclosure is not limited thereto. In some embodiments, the lengths in the first direction DR1 of the first main area MR1, the second main area MR2, the third main area MR3, and the fourth main area MR4 may be the same or substantially the same as each other.

The functional layer 310 may include a first portion 311 disposed on the rear face of the display panel 10 at (e.g., in or on) the first main area MR1, a second portion 312 disposed on the rear face of the display panel 10 at (e.g., in or on) the second main area MR2, a third portion 313 disposed on the rear face of the display panel 10 at (e.g., in or on) the third main area MR3, and a fourth portion 314 disposed on the rear face of the display panel 10 at (e.g., in or on) the fourth main area MR4.

In an embodiment, a hardness of the first portion 311 of the functional layer 310 may be the same or substantially the same as a hardness of the third portion 313 of the functional layer 310. A hardness of the second portion 312 of the functional layer 310 may be the same or substantially the same as a hardness of the fourth portion 314 of the functional layer 310. The hardness of each of the second portion 312 and the fourth portion 314 of the functional layer 310 may be greater than that of each of the first portion 311 and the third portion 313 of the functional layer 310.

In other words, each of the first portion 311 and the third portion 313 of the functional layer 310 may have a smaller modulus value than that of each of the second portion 312 and the fourth portion 314 of the functional layer 310.

Further, the first portion 311 and the third portion 313 of the functional layer 310 may have the same or substantially the same modulus value as each other, while the second portion 312 and the fourth portion 314 of the functional layer 310 may have the same or substantially the same modulus value as each other. However, the present disclosure is not limited thereto. In some embodiments, the first portion 311, the second portion 312, the third portion 313, and the fourth portion 314 of the functional layer 310 may have different modulus values from each other.

Because each of the first portion 311 and the third portion 313 included in the functional layer 310 has a relatively lower hardness than that of each of the second portion 312 and the fourth portion 314 of the functional layer 310, each of the first portion 311 and the third portion 313 maintains or substantially maintains a sufficient elasticity against external shocks. Each of the second portion 312 and the fourth portion 314 included in the functional layer 310 has a relatively higher hardness than that of each of the first portion 311 and the third portion 313. Thus, when pressure is applied to the cover panel 300 in a process of placing the step-compensation member 400 and the display driving substrate 30 thereon, each of the second portion 312 and the fourth portion 314 may maintain or substantially maintain a shape of the cover panel 300. Further, each of the second portion 312 and the fourth portion 314 may play a role in improving an adhesion due to the high hardness thereof.

In an embodiment, the functional layer 310 may have a modulus of 0.001 MPa to 100 Gpa.

When the functional layer 310 has a modulus of 0.0001 MPa or greater, the functional layer 310 disposed on the rear face of the display panel 10 may have sufficient rigidity to support the display panel 10. When the functional layer 310 has a modulus of 100 MPa or smaller, the functional layer 310 may maintain or substantially maintain sufficient elasticity against an impact force of the external impact that the display device 1 receives. However, the modulus of the functional layer 310 is not limited to the numerical range described above.

In an embodiment, each of the first portion 311 and the third portion 313 of the functional layer 310 may include a first organic compound, in which a first organic material and a second organic material are mixed with each other.

In other words, each of the first portion 311 and the third portion 313 of the functional layer 310 may be formed via an acrylic curing reaction between a reducing agent contained in the first organic material and a peroxide contained in the second organic material.

The first organic material may include an oligomer, a monomer, a light absorbing material, an accelerator, and the reducing agent.

The oligomer and the monomer may bind to the light absorbing material, the accelerator, and the reducing agent as above-described, and may act as base materials of each of the first portion 311 and the third portion 313 of the functional layer 310.

The oligomer may include a (meth)acrylate oligomer. The (meth)acrylate is a generic term of acrylate and methacrylate.

For example, the oligomer may include at least one (meth)acrylate oligomer selected from the group consisting of a polyurethane (meth)acrylate oligomer, a polyisoprene (meth)acrylate oligomer, a polybutadiene (meth)acrylate oligomer, and a (meth)acrylate copolymer having a (meth)acryloyl group. In some embodiments, the oligomer may include at least one selected from the group consisting of a polyurethane (meth)acrylate oligomer, and a methacrylate copolymer having a (meth)acryloyl group.

In more detail, the polyurethane (meth)acrylate oligomer is referred to as (meth)acrylate modified polyurethane, and may have a molecular weight of 1000 to 100000, or more specifically, for example, 1000 to 50000.

When the polyurethane has a (meth)acrylate group as a substituent, a structure of the polyurethane is not particularly limited. For example, a polyurethane (meth)acrylate oligomer may be obtained using a polyurethane having a skeleton such as polyether or polycarbonate as a raw material. The polyurethane (meth)acrylate oligomer may be polyetherurethane (meth)acrylate, polycarbonate urethane (meth)acrylate, or polyesterurethane (meth)acrylate in terms of compatibility with a compound described in more detail below. Commercially available products thereof may include, for example, "UN-9200A" (polycarbonate urethane (meth)acrylate from Negami Chemical Industrial) and "UA-10000 B" (polyether urethane (meth)acrylate from KSM).

The polyisoprene (meth)acrylate oligomer is referred to as (meth)acrylate modified polyisoprene, and may have a molecular weight of 1000 to 100000, or more specifically, for example, 1000 to 50000. Commercially available products thereof may include, for example, "UC-102M" (molecular weight 17000) and "UC203M" (molecular weight 35000) from kuraray.

The polybutadiene (meth)acrylate oligomer is also referred to as (meth)acrylate-modified polybutadiene, and may have a molecular weight of 500 to 100000, or more specifically, for example, 1000 to 30000. Commercially available products thereof may include, for example, TE2000 (molecular weight 2000) from Soda of Japan.

The (meth)acrylate copolymer having a (meth)acryloyl group is a copolymer including a monomer having a (meth)acryloyl group, and may have a molecular weight of 5000 to 30000, or more specifically, for example, 10000 to 100000. The monomer constituting the copolymer may include, for example, two or more types of monomers selected from the group consisting of urethane, isoprene, butadiene, and (meth)acrylic acid ester. The copolymer may contain the monomer at any suitable percentage, as long as the copolymer has unreacted (meth)acryloyl group. The copolymer may have random polymerization or block polymerization.

The monomer contained in the first organic material may be a monofunctional (meth)acrylate monomer. For example, a type of the monofunctional (meth)acrylate monomer may be selected, without being particularly limited thereto, by an organic group to which an acryl group or a methacryl group is bonded. Examples of the organic group may include an alkyl group, an alkenyl group, an alkynyl group, an aryl group, and/or a cycloalkyl group. At least one organic group may be substituted with an alkoxy group having a structure in which oxygen is bonded to a cycloalkyl group, a hydroxyl group, or an aryl group, or with an aryloxy group having a structure in which oxygen is bonded to an aryl group. Further, the alkyl group, the alkenyl group, the alkynyl group, the aryl group, and the cycloalkyl group may constitute an ether structure interrupted with an oxygen atom at one or more locations, or a secondary or tertiary amine structure interrupted with a nitrogen atom at one or more locations.

In more detail, the monofunctional (meth)acrylate monomer may include, for example, 2-ethylhexyl (meth)acrylate, n-butyl (meth)acrylate, isobutyl (meth)acrylate, t-butyl (meth)acrylate, isodecyl (meth)acrylate, lauryl (meth)acrylate, benzyl (meth)acrylate, phenyl (meth)acrylate, dicyclopentanyl (meth)acrylate, dicyclopentenyloxyethyl (meth)acrylate, norbornene (meth)acrylate, cyclohexyl (meth)acrylate (CH), 2-hydroxyethyl (meth)acrylate, 2-hydroxypropyl (meth)acrylate, 2-hydroxybutyl (meth)acrylate, 4-hydroxybutyl (meth)acrylate, methoxyethyl (meth)acrylate, phenoxyethyl (meth)acrylate (PO), phenoxy polyethylene glycol (meth)acrylate (molecular weight smaller than 1000), 2-hydroxy 3-phenoxypropyl (meth) acrylate, nonylphenol EO additive (meth)acrylate, trimethoxy ethylene glycol (meth)acrylate, tetrahydrofurfuryl (meth)acrylate, pentamethylpiperidyl (meth)acrylate, and/or acryloyl morpholine. One type or two or more types of the above (meth)acrylate monomers may be used.

Monofunctional or bifunctional (meth)acryloyl group-containing monomer (meth)acrylate monomer solidifies a base resin during curing, thereby exhibiting excellent adhesion to an adherend.

The monofunctional or bifunctional (meth)acryloyl group-containing monomer (meth)acrylate monomer may include a (meth)acrylate having a polar group, for example, such as a (meth)acrylate containing a hydroxyl group, a (meth)acrylate containing a carboxyl group, and/or an acrylate containing an amino group, and a (meth)acrylate monomer having a low polarity molecular structure, for example, such as an aliphatic (meth)acrylate monomer, an alicyclic (meth)acrylate monomer, and/or an aromatic (meth)acrylate monomer.

The above (meth)acrylate monomer may include a monofunctional (meth)acrylate monomer, and a bifunctional (meth)acrylate monomer, which may be used alone, or in a suitably combined manner.

In more detail, a hydroxyl group-containing (meth)acrylate monomer may include, for example, 2-hydroxyethyl (meth)acrylate, 2-hydroxypropyl (meth)acrylate, 2-hydroxybutyl (meth)acrylate, 2-hydroxy 3-phenoxypropyl (meth)acrylate, 2-(meth)acryloyloxyethyl-2-hydroxypropyl phthalate, and/or glycerol mono (meth)acrylate.

Examples of a carboxyl group-containing (meth)acrylate monomer may include 2-(meth)acryloyloxyethylcohexane, 2-(meth)acryloyloxyethylsuccinic acid, 2-(meth)acryloyloxyethylphthalic acid, and/or 2-(meth)acryloyl oxyethal hexahydrophthalic acid.

Examples of a (meth)acrylate monomer containing an amino group may include diethylaminoethyl (meth)acrylate and/or dimethylaminomethyl (meth)acrylate.

The aliphatic (meth)acrylate may include, for example, lauryl (meth)acrylate, 2-ethylhexyl (meth)acrylate, isodecyl (meth)acrylate, stearyl (meth)acrylate, and/or 1,6-hexanediol (meth)acrylate. The aromatic (meth)acrylate may include, for example, benzyl (meth)acrylate.

The alicyclic (meth)acrylate refers to a (meth)acrylate having a monocyclic or polycyclic alicyclic hydrocarbon group having 3 to 20 carbon atoms, and may include, for example, cyclohexyl (meth)acrylate, isobornyl (meth)acrylate, dicyclopentenyloxyethyl (meth)acrylate, dicyclopentadienyl (meth)acrylate, tricyclodecynyl (meth)acrylate, and/or norbornyl (meth)acrylate.

Commercially available products of the monofunctional or bifunctional (meth)acryloyl group-containing monomer may include, for example, "SA-1002" from Mitsubishi Chemical, "KAYARAD R-684" from Nippon Chemicals, and "Light Ester BZ", "Light Ester IB-X", and Light Ester HO-MS" from Kyoeisha Chemicals.

The light absorbing material contained in the first organic material prevents or substantially prevents light leakage. In other words, the light absorbing material may allow the functional layer 310 to perform a light-blocking function. The light absorbing material may contain colored particles. The colored particles may include, for example, carbon black, titanium nitride oxide, titanium black, phenylene black, aniline black, cyanine black, nigrosine acid black, black resin, and/or the like. In more detail, because carbon black absorbs light in a visible region well, an excellent light leakage prevention effect may be obtained when the carbon black is used as the light absorbing material. However, the present disclosure is not limited thereto. In some embodiments, particles of various suitable colors capable of realizing a light absorption effect may be used.

The first organic material may contain the accelerator to accelerate a reaction with the second organic material. For example, the accelerator may be an acid compound, such as a phosphoric acid compound(phosphate)

For example, the phosphate may include Monomethy phosphates, Dimethyl phosphates, Monoethyl phosphates, Diethyl phosphates, Monoisopropyl phosphates, Diisopropyl phosphates, Mono butyl phosphates, Dibutyl phosphates, Mono-β-chloroethyl phosphate, Di-β-chloroethyl phosphate, Mono-β-bromoethyl phosphate, Di-β-bromoethyl phosphate, Mono ethoxy ethyl phosphates, Diethoxy ethyl phosphates, Mono butoxy ethyl phosphates, Dibutoxy ethyl phosphates, Phenyl phosphates, Diphenyl phosphates, Phenylphosphonic Acid, Diphenylphosphonic Acid, Phenylphosphonite, or Di-Phenylphosphonite. One or a mixture of two or more thereof may be used.

The reducing agent contained in the first organic material may include an organic material or an inorganic material. The reducing agent may include multivalent metal ions, such as cobalt, iron, zinc, and/or vanadium. For example, the reducing agent may include iron and vanadium in terms of an environmental, or may include vanadium in terms of reaction stability.

Further, the reducing agent contained in the first organic material may include a soluble vanadium compound. For example, the soluble vanadium compound may include Vanadyl acetylacetonate, Vanadyl stearate, Vanadium naphthenate, vanadium acetyl acetonato, vanadium benzoyl acetonate, Vanadyl Oxalate n-Hydrate, and/or the like. Stability, reducing ability, and diffusing ability in a solution may be adjusted using one or two types of reducing agents.

The second organic material contained in each of the first portion 311 and the third portion 313 of the functional layer 310 may include an oligomer, a monomer, a light absorbing material, and a peroxide.

The oligomer, the monomer, and the light absorbing material contained in the second organic material may be the same or substantially the same as the oligomer, the monomer, and the light absorbing material contained in the first organic material, respectively, as described above, and thus, redundant description thereof may not be repeated. However, the present disclosure is not limited thereto.

The second organic material may contain peroxide that reacts with the reducing agent contained in the first organic material, so as to advance the acrylic curing reaction.

In more detail, peroxide, such as hydro peroxide and ketone peroxide, contained in the second organic material efficiently generates radicals even at low temperatures due to redox reaction with the reducing agent, such as metal salts contained in the first organic material, and may allow the acrylic curing reaction to occur.

The peroxide contained in the second organic material may include, for example, Hydroperoxides, such as Tert-Butyl hydroperoxide, p-menthane hydroperoxide, Cumene Hydroperoxide, and/or Diisopropylbenzene hydroperoxide, or Peroxy esters, such as T-butyl peroxy laurate, T-butyl peroxy benzoate, and/or T-butyl peroxide decanoate. For example, in some embodiments, the peroxide contained in the second organic material may include a hydroperoxide.

In some embodiments, in a suitable range, each of the first portion 311 and the third portion 313 of the functional layer 310 may also contain, in addition to the first organic material and the second material, an inorganic filler, an antioxidant, a polymerization inhibitor, a plasticizer, an organic filler, various suitable elastomers, such as acrylic rubber or urethane rubber, a graft copolymer, such as methacrylic acid methyl-butadiene-styrene-based graft copolymer or acrylonitrile-butadiene-styrene-based graft copolymer, a solvent, an extender, a reinforcing material, a thickener, a flame retardant, a surfactant, a thermal polymerization initiator, and/or a silane coupling agent.

In more detail, the functional layer 310 may further contain the inorganic filler to adjust the light-blocking function, elastic modulus, and liquidity of the functional layer 310.

The inorganic filler may include, for example, quartz, quartz glass, silica powder, such as fused silica or spherical silica, spherical alumina, crushed alumina, oxides, such as magnesium oxide, beryllium oxide, or titanium oxide, nitrides, such as boron nitride, silicon nitride, or aluminum nitride, oxides, such as silicon oxide, hydroxides, such as aluminum hydroxide and/or magnesium hydroxide, metals, such as copper, silver, iron, aluminum, nickel, titanium, or suitable alloys thereof, carbon-based fillers, such as diamond, carbon black, or acetylene black, and/or a glass filler made of a composite oxide. One or two or more types of these inorganic fillers may be used.

The functional layer 310 may further contain the antioxidant for stability of a composition. The antioxidant may include phenol-based antioxidants, hydroquinone-based antioxidants, and/or other antioxidants. For example, in some embodiments, the functional layer 310 may further include a phenol-based antioxidant. The phenol-based antioxidant may include 2,2-methylene-bis 4-methyl-6-tert-butylphenol, catechol, picric acid, tert-butylcatechol, 2,6-ditertiarybutyl-p-cresol and/or 4,4'-thiobis[ethylene(oxy)(carbonyl)(ethylene)]bis[2,6-bis(1,1-dimethylethyl)phenol].

Examples of the hydroquinone-based antioxidant may include β_naphthoquinone, 2-methoxy-1,4-naphthoquinone, methylhydroquinone, hydroquinone, hydroquinone monomethyl ether, monotertiary butyl hydroquinone, 2,5-ditertiary butyl hydroquinone, p-benzoquinone, 2,5-diphenyl-p-benzoquinone, and/or 2,5-ditertiarybutyl-p-benzoquinone. Other antioxidants may include citric acid, phenothiazine, and/or 2-butyl-4-hydroxyanisole.

Commercially available products of the antioxidant may include, for example, IRGANOX1010 and IRGANOX1035FF (both produced from Ciba Specialty Chemicals).

The functional layer 310 may further contain the polymerization inhibitor to obtain desired properties of a cured product.

Examples of the polymerization inhibitor may include a phenol-based polymerization inhibitor and/or a phenothiazine-based polymerization inhibitor. The phenol-based polymerization inhibitors may include 2,2-methylenebis(4-methyl-6-tertbutylphenol) (BHT), catechol, picric acid, tert-butylcatechol, 2,6-ditertiarybutyl-p-cresol, and/or 4,4'-thiobis[ethylene(oxy)(carbonyl)(ethylene)]bis[2,6-bis(1,1-dimethylethyl)phenol]. Examples of the phenothiazine-based polymerization inhibitor may include bis(α-methylbenzyl)phenothiazine, 3,7-dioctylphenolthiazine, and/or bis(α,α-dimethylbenzyl)phenothiazine. Further, the phenol-based polymerization inhibitor, such as BHT, may also be used as the antioxidant.

The functional layer 310 may further contain the plasticizer for improving heat resistance of the functional layer 310, while further improving adhesiveness and adhesive durability thereof. The plasticizer may employ an oligomer obtained by epoxidizing an unsaturated bond of polybutadiene. Commercially available products thereof may include, for example, BF-1000 (from ADEKA) or PB-3600 from (Daicel Industrial Chemicals).

The functional layer 310 may further contain the silane coupling agent for further improving adhesion.

The silane coupling agent may include γ-chloropropyltrimethoxysilane, vinyltrimethoxysilane, vinyltrichlorsilane, vinyltriethoxysilane, vinyltris(β-methoxyethoxy)silane, γ-methacryloxypropyltrimethoxy silane, γ-Acryoxypropyltrimethoxysilane, β-(3,4-epoxycyclohexyl), ethyltrimethoxysilane, γ-glycidoxypropyltrimethoxysilane, γ-mercaptopropyltrimethoxysilane, γ-aminopropyltrimethoxysilane, N-β-(aminoethyl)-γ-aminopropyltrimethoxysilane, N-β-(aminoethyl)-γ-aminopropylmethyldimethoxysilane and γ-ureidepropyltriethoxysilane, and/or the like. In an embodiment, the silane coupling agent may include γ-glycidoxypropyltrimethoxysilane, γ-glycidoxypropyltri ethoxysilane, 2-(3,4-epoxycyclohexyl)ethyltrimethoxysilane, and/or γ-glycidoxypropylmethyldiethoxysilane. One type or a mixture of two or more types of these silane coupling agents may be used.

In an embodiment, each of the second portion 312 and the fourth portion 314 of the functional layer 310 may include a second organic compound, in which a third organic material and a fourth organic material are mixed with each other.

In other words, in a similar manner to each of the first portion 311 and the third portion 313 of the functional layer 310, each of the second portion 312 and the fourth portion 314 of the functional layer 310 may be formed via an acrylic curing reaction between the reducing agent contained in the third organic material and the peroxide contained in the fourth organic material.

As described above, the hardness of each of the second portion 312 and the fourth portion 314 of the functional layer 310 has a higher value than that of each of the first portion 311 and the third portion 313 of the functional layer 310. Thus, a composition of the third organic material contained in each of the second portion 312 and the fourth portion 314 of the functional layer 310 may be different from a composition of the first organic material contained in each of the first portion 311 and the third portion 313 of the functional layer 310. A composition of the fourth organic material thereof may be different from a composition of the second organic material contained in each of the first portion 311 and the third portion 313 of the functional layer 310.

In other words, the third organic material contained in each of the second portion 312 and the fourth portion 314 of the functional layer 310 may include an oligomer, a monomer, a light absorbing material, an accelerator, and a reducing agent, similar to those of the first organic material. The fourth organic material contained in each of the second portion 312 and the fourth portion 314 of the functional layer 310 may include an oligomer, a monomer, a light-absorbing material, and peroxides, similar to those of the second organic material contained in each of the first portion 311 and the third portion 313 of the functional layer 310. However, a composition of each of the oligomer and the monomer included in each of the third organic material and the fourth organic material may be different from a composition of each of the oligomer and the monomer included in each of the first organic material and the second organic material.

For example, in an embodiment, a content of 2-ethylhexyl (meth)acrylate in each of the third organic material and the fourth organic material may be lower than that in each of the first organic material and the second organic material, while a content of isobornyl (meth)acrylate in each of the third organic material and the fourth organic material may be higher than that in each of the first organic material and the second organic material. However, the present disclosure is not limited thereto. A composition and a content of each of the oligomer and the monomer contained in the third organic material and the fourth organic material may be different from those in the first organic material and the second organic material in various suitable manners.

Therefore, each of the second portion 312 and the fourth portion 314 of the functional layer 310 made of the second organic compound obtained by mixing the third organic material and the fourth organic material with each other may have a hardness higher than that of each of the first portion 311 and the third portion 313 of the functional layer 310 made of the first organic compound obtained by mixing the first organic material and the second organic material with each other.

In some embodiments, each of the second portion 312 and the fourth portion 314 of the functional layer 310 may further contain various suitable additives, similar to those of the first portion 311 and the third portion 313 of the functional layer 310. A composition and a content of each of the additives contained in each of the second portion 312 and the fourth portion 314 of the functional layer 310 may be different from those in each of the first portion 311 and the third portion 313 of the functional layer 310, such that the hardness of each of the second portion 312 and the fourth portion 314 of the functional layer 310 is higher than that of each of the first portion 311 and the third portion 313 of the functional layer 310.

In an embodiment, the functional layer 310 may have a suitable thickness (e.g., a predetermined thickness) d, so as to perform a light-blocking function and a shock absorbing function. For example, the functional layer 310 may have the thickness d in a range of 20 μm to 140 μm.

When the functional layer 310 including the light absorbing material has the thickness d of 20 μm or larger, the layer 310 may effectively prevent the components disposed on the rear face of the display panel 10 from being visible to a viewer. When the functional layer 310 has the thickness d of 140 μm or smaller, the layer 310 may maintain or substantially maintain sufficient elasticity against an impact force of the external impact that the display device 1 receives, while increasing curability of the functional layer 310 in the process of forming the functional layer 310. However, the thickness d of the functional layer 310 is not limited to the numerical range described above.

In an embodiment, the functional layer 310 included in the cover panel 300 contains the light absorbing material for absorbing light as described above, and thus, may perform a light-blocking function. Concentrations of the light absorbing materials contained in the front face and the rear face of the functional layer 310 may be equal to or substantially equal to each other.

Accordingly, an optical density (OD) value of the functional layer 310 may be in a range of 3 to 4. When the optical density value of the functional layer 310 is in the range of 3 to 4, the light incident thereto from the outside out of the display device 1 may not be absorbed by the layer 310. Accordingly, a phenomenon in which the components disposed on the rear face of the display panel 10 may be visible to the viewer may be efficiently prevented. However, the optical density value of the functional layer 310 is not limited to the numerical range described above.

Referring to FIG. 5, the heat-dissipation layer 320 may be disposed on the rear face of the functional layer 310. In more detail, the heat-dissipation layer 320 may be disposed on an entirety of the rear face of each of the first portion 311, the second portion 312, the third portion 313, and the fourth portion 314 of the functional layer 310. The heat-dissipation layer 320 may include a metal material with high thermal conductivity, such as copper, aluminum, or gold.

Although, the heat-dissipation layer 320 is illustrated as a single layer in FIG. according to an embodiment, the present disclosure is not limited thereto. In some embodiments, the heat-dissipation layer 320 may be composed of a plurality of layers. For example, the heat-dissipation layer 320 may be composed of a first heat-dissipation layer including graphite or carbon nanotubes, and a second heat-dissipation layer as a metal thin-film made of copper, nickel, ferrite, and/or silver that may shield electromagnetic waves, and has excellent thermal conductivity.

Because the heat-dissipation layer 320 is disposed on the rear face of the display panel 10, heat generated from the display panel 10 may easily escape to the outside through the heat-dissipation layer 320.

In an embodiment, the step-compensation member 400 may be disposed on the rear face of the second portion 312 of the functional layer 310, with the heat-dissipation layer 320 interposed therebetween. The step-compensation member 400 may be the same or substantially the same as that described above with reference to FIG. 4, and thus, redundant description thereof may not be repeated.

As described above, each of the first portion 311, the second portion 312, the third portion 313, and the fourth portion 314 of the functional layer 310 includes the light absorbing material. Thus, the functional layer 310 may perform the light-blocking function to block external light incident on the display panel 10. Further, the functional layer 310 includes the first portion 311 and the third portion 313 with the relatively lower hardness, made of the organic material, and having a suitable thickness (e.g., a predetermined thickness). Therefore, the layer 310 may absorb the impact force of the external impact to a portion of the display device 1 on the rear face of the display panel 10.

Hereinafter, other embodiments of the present disclosure will be described with reference to FIG. 6 through FIG. 10. In the following embodiments, redundant description of components that are the same or substantially the same as those described above may not be repeated or may be simplified, and the differences between the embodiments may be mainly described.

Figure 6:
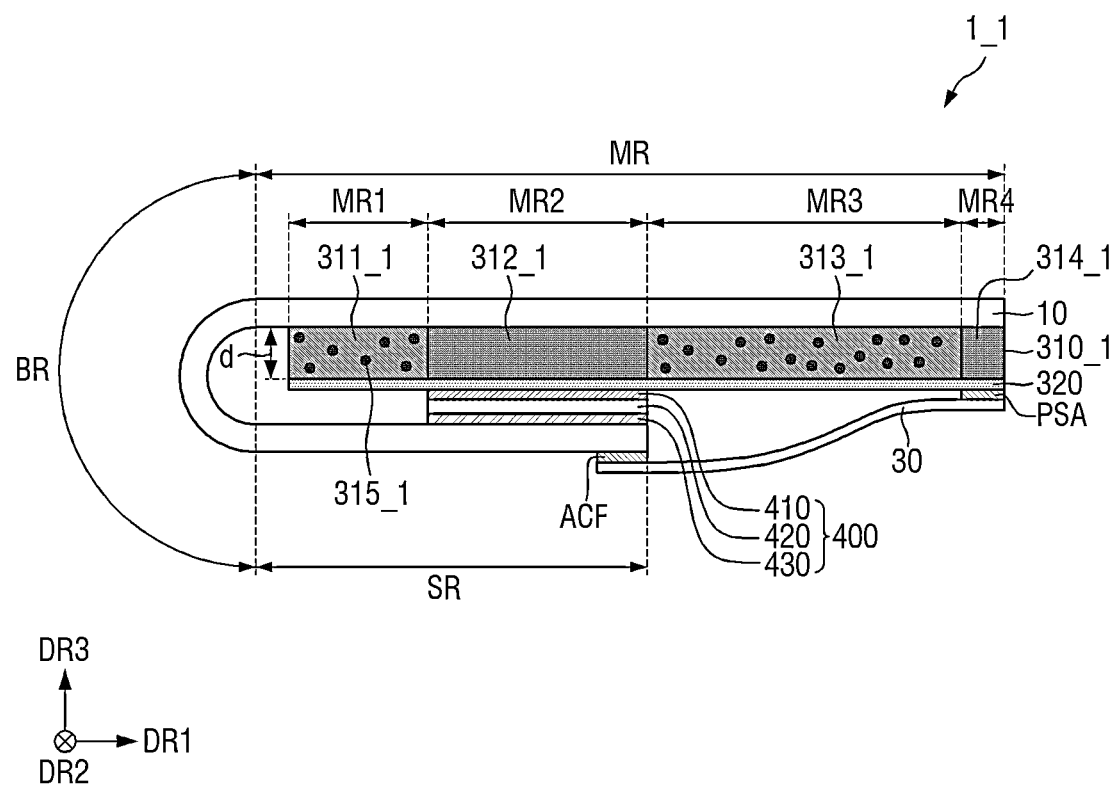
FIG. 6 is a schematic cross-sectional view of a display device according to another embodiment.
Figure 7:
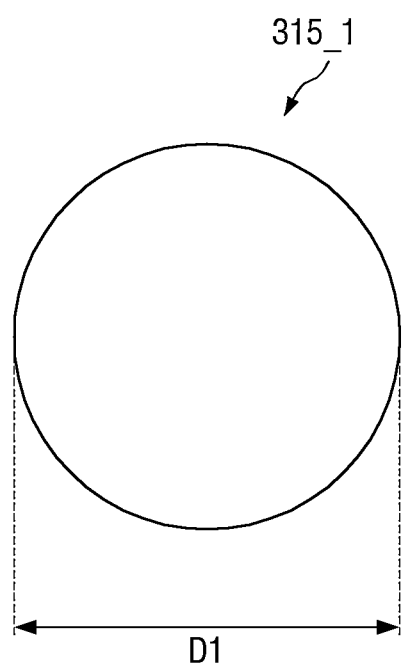
FIG. 7 is a schematic cross-sectional view of an elastomer particle included in a display device according to an embodiment.
Figure 8:
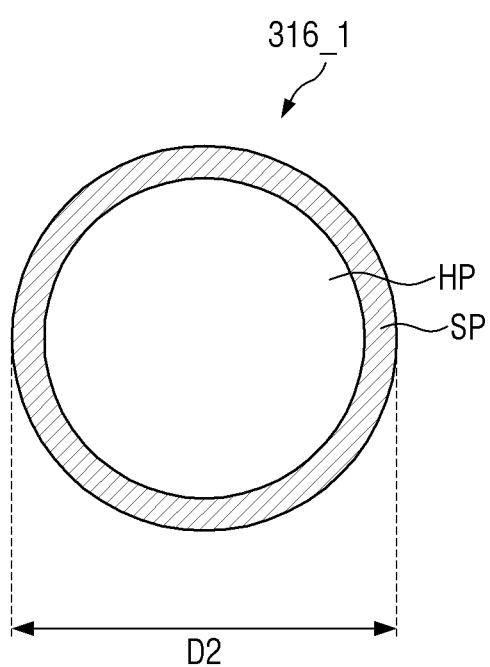
FIG. 8 is a schematic cross-sectional view of a hollow particle included in a display device according to another embodiment.

FIG. 6 is a schematic cross-sectional view of a display device according to another embodiment. FIG. 7 is a schematic cross-sectional view of an elastomer particle included in a display device according to an embodiment. FIG. 8 is a schematic cross-sectional view of a hollow particle included in a display device according to another embodiment.

Referring to FIG. 6, a display device 1_1 according to another embodiment may further include elastomer particles 315_1 in each of a first portion 311_1 and a third portion 313_1 of a functional layer 310_1, which may be different from the display device 1 described above. In other words, the plurality of elastomer particles 315_1 may be dispersed in each of the first portion 311_1 and the third portion 313_1, but may be absent in each of the second portion 312_1 and the fourth portion 314_1 of the functional layer 310_1.

As shown in FIG. 7, each of the elastomer particles 315_1 included in each of the first portion 311_1 and the third portion 313_1 of the functional layer 310_1 may be a full-solid spherical particle. In other words, the elastomer particle 315_1 may have an entire inner space corresponding to a diameter (e.g., a predetermined diameter) D1 that is fully filled with an elastomer material.

The elastomer particle 315_1 may have the diameter D1 in a range of 100 nm to 5 µm. When the diameter D1 of the elastomer particle 315_1 is 100 nm or larger, the elastomer particle 315_1 is received in each of the first portion 311_1 and the third portion 313_1 of the functional layer 310_1, so as to absorb the external impact to each of the first portion 311_1 and the third portion 313_1 and to improve the impact resistance thereof. When the diameter D1 of the elastomer particle 315_1 is 5 µm or smaller, an elastic modulus of each of the first portion 311_1 and the third portion 313_1 may be increased to protect the display panel 10 from the external impact, while the elastic force is maintained or substantially maintained. However, the diameter D1 of the elastomer particle 315_1 is not limited to the numerical range described above.

Referring to FIG. 6 and FIG. 7, the diameters D1 of the elastomer particles 315_1 received in the first portion 311_1 and the third portion 313_1 of the functional layer 310_1 may be uniform or substantially uniform (e.g., may be the same or substantially the same as each other). However, the present disclosure is not limited thereto. In some embodiments, the diameters D1 of the elastomer particles 315_1 included in the first portion 311_1 and the third portion 313_1 of the functional layer 310_1 may not be uniform.

The elastomer particles 315_1 may include at least one of a polymer, such as polyethylene ether phthalate (PET), polyimide (PI), polycarbonate (PC), polymethyl methacrylate (PMMA), and/or polyethylene (PE), or an elastomer, such as polyurethane (PU), silicone, polyisoprene, and/or the like. However, the present disclosure is not limited thereto.

Because the elastomer particles 315_1 are contained in the functional layer 310 that performs the light-blocking function, the elastomer particles 315_1 may have a suitable color. The elastomer particles 315_1 may include, for example, carbon black, titanium nitride oxide, titanium black, phenylene black, aniline black, cyanine black, nigrosine acid black, black resin, and/or the like. However, the present disclosure is not limited thereto. In some embodiments, the elastomer particle 315_1 may have various suitable colors that may implement a light absorption effect.

Referring to FIG. 8, in some embodiments, each of the first portion 311_1 and the third portion 313_1 of the functional layer 310_1 may contain hollow particles 316_1. Each of the hollow particles 316_1 may be a hollow spherical particle. In other words, the hollow particle 316_1 may have a core-shell structure.

The hollow particle 316_1 may include a core HP, and a shell SP surrounding (e.g., around a periphery of) the core HP. The core HP may be defined by the shell SP. The shell SP may be a layer including the same or substantially the same polymeric or elastomeric material as that of the elastomer particle 315_1 shown in FIG. 7 described above.

In an embodiment, the core HP may be filled with air. However, the present disclosure is not limited thereto, and the core HP may be filled with a liquid or a gas having elastic properties.

In an embodiment, a diameter D2 of the hollow particle 316_1 may be the same or substantially the same as the diameter D1 of the elastomer particle 315_1 described above. In other words, the diameter D2 of the hollow particle 316_1 may be in a range of 100 nm to 5 µm. However, the diameter D2 of the hollow particle 316_1 is not limited to the above-described numerical range.

Because the hollow particles 316_1 are received in the first portion 311_1 and the third portion 313_1 of the functional layer 310_1 that performs a light-blocking function similar to that of the elastomer particle 315_1 as described above, the shell SP of the hollow particles 316_1 may include the same or substantially the same material as that of the elastomer particle 315_1 and may have a suitable color. In some embodiments, the shell SP may have various suitable colors capable of realizing a light absorption effect.

In some embodiments, the elastomer particles 315_1 and the hollow particles 316_1 may be received in each of the first portion 311_1 and the third portion 313_1 included in the functional layer 310_1 in a mixed manner.

As described above, the functional layer 310_1 contains therein the elastomer particle 315_1 and/or the hollow particle 316_1. Thus, when an external impact is applied to the functional layer 310_1, the external impact force may be applied to the elastomer particle 315_1 or the hollow particle 316_1, and thus, may be absorbed by the elastomer particles 315_1 or the hollow particles 316_1.

Accordingly, an amount of the external impact applied to the functional layer 310_1 that is delivered to the components disposed on the rear face of the functional layer 310_1 may be reduced. As a result, the impact resistance of the display device 1_1 may be improved due to the functional layer 310_1.

Figure 9:
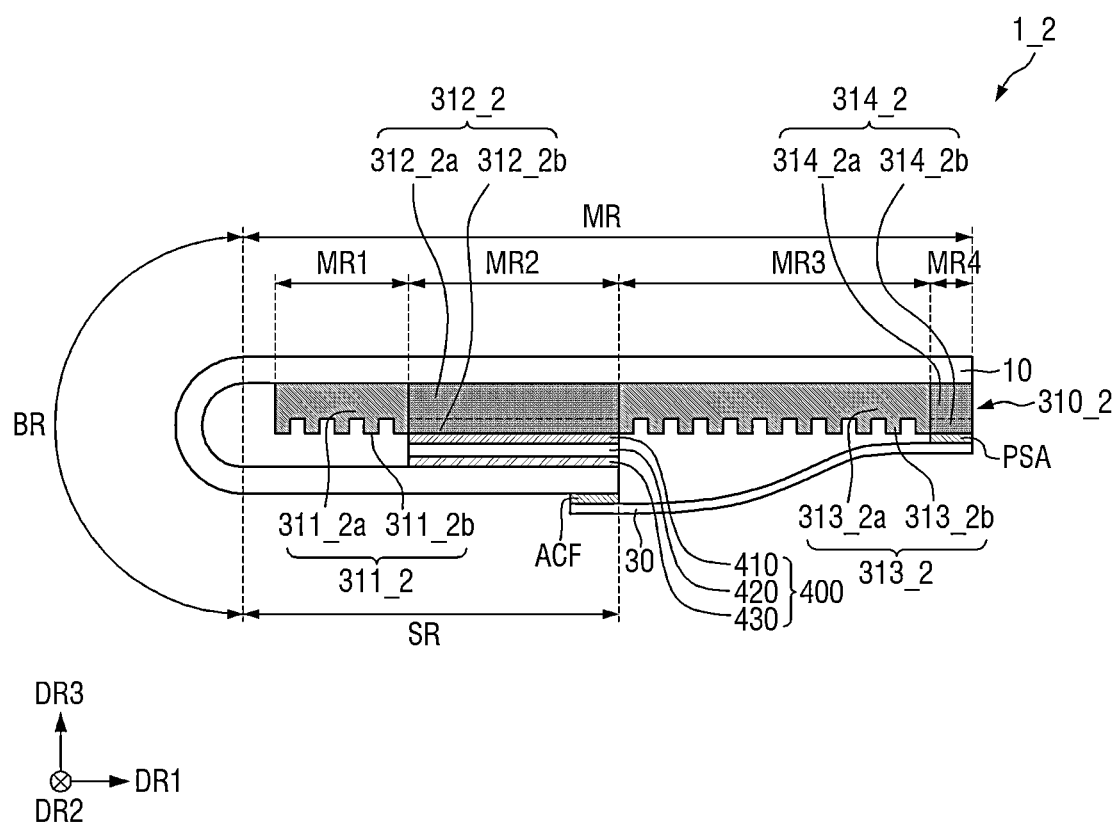
FIG. 9 is a schematic cross-sectional view of a display device according to another embodiment.
Figure 10:
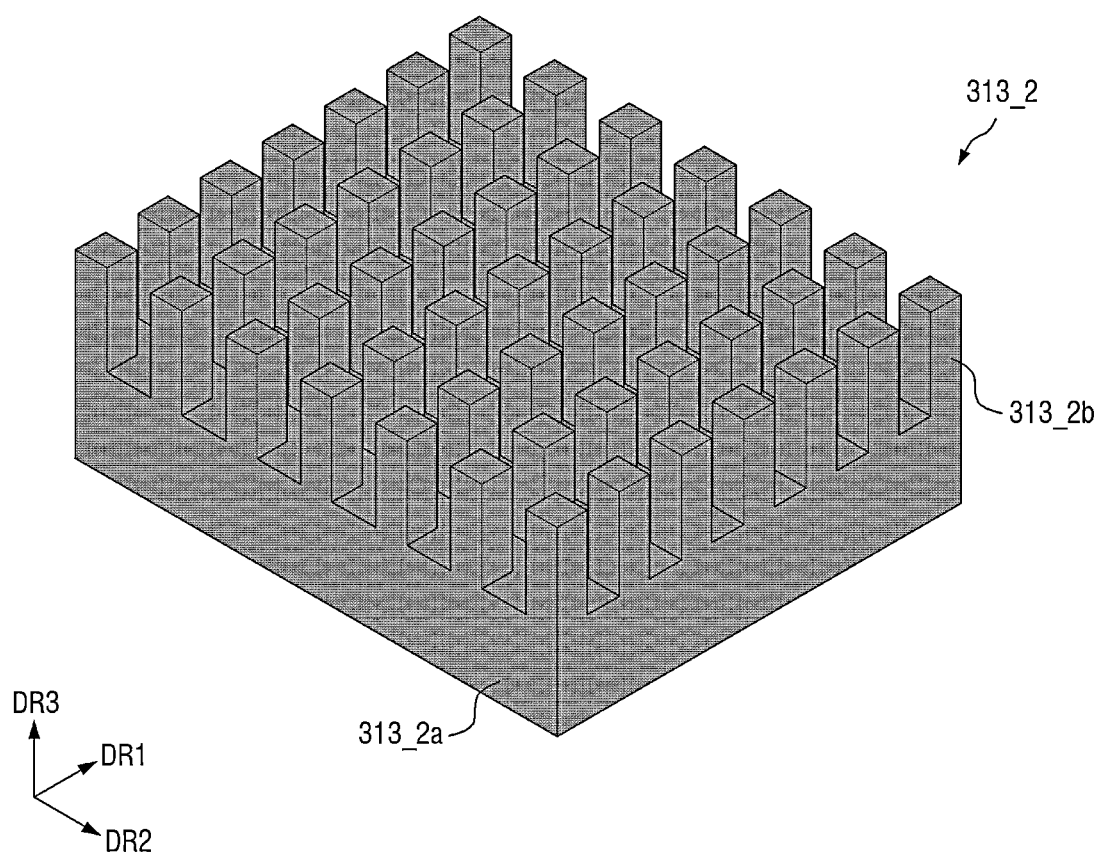
FIG. 10 is a perspective view showing a portion of a functional layer according to an embodiment.
Figure 11:
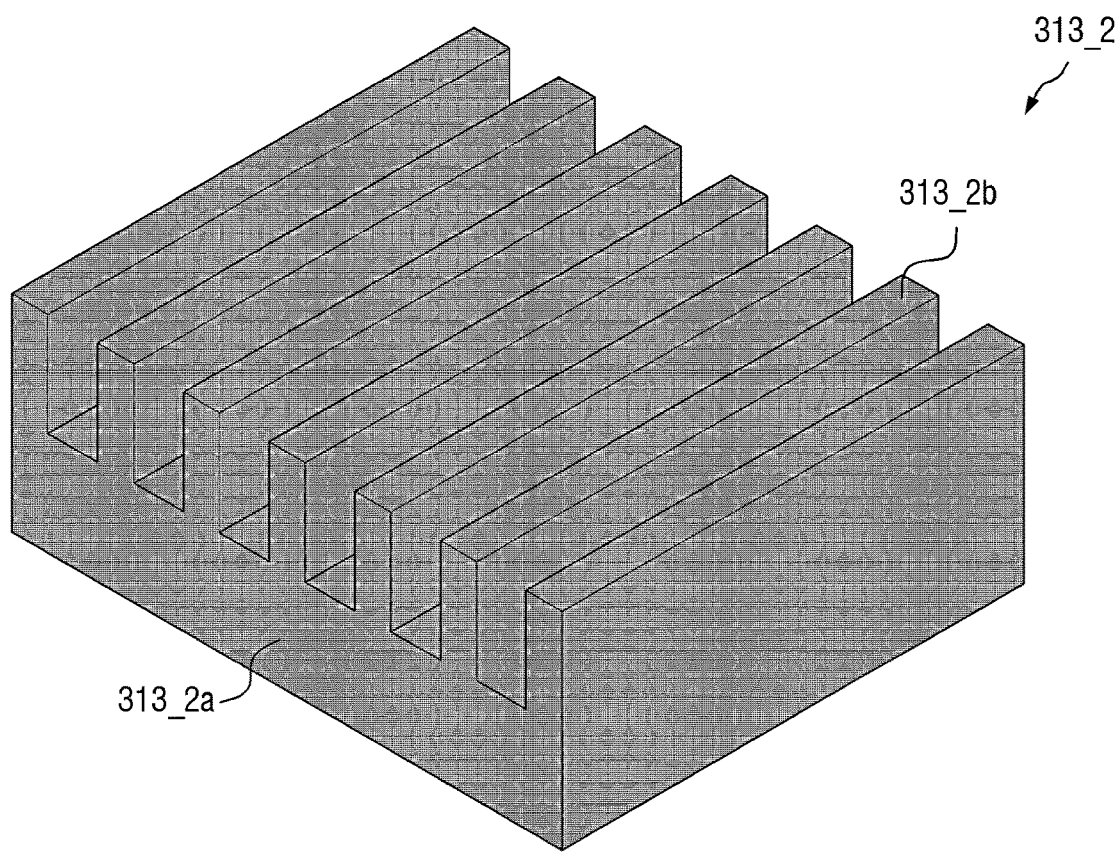
FIG. 11 is a perspective view showing a portion of a functional layer according to another embodiment.

FIG. 9 is a schematic cross-sectional view of a display device according to another embodiment. FIG. 10 is a perspective view showing a portion of a functional layer according to an embodiment. FIG. 11 is a perspective view showing a portion of a functional layer according to another embodiment.

Referring to FIG. 9, a display device 1_2 according to another embodiment may be different from the display device 1 described above, in that a plurality of first protrusions 311_2b are formed in a first portion 311_2 of a functional layer 310_2, a plurality of second protrusions 313_2b are formed in a third portion 313_2 of the functional layer 310_2, and the heat-dissipation layer 320 (e.g., see FIG. 5) is not disposed on the rear face of the functional layer 310_2.

As shown in FIG. 9, the first portion 311_2 of the functional layer 310_2 may include a first base 311_2a, and at least one first protrusion 311_2b disposed on a bottom face of the first base 311_2a to protrude downwardly of the functional layer 310_2. The third portion 313_2 of the functional layer 310_2 may include a third base 313_2a, and at least one second protrusion 313_2b disposed on a bottom face of the third base 313_2a to protrude downwardly of the functional layer 310_2.

Further, a second portion 312_2 of the functional layer 310_2 may include a second base 312_2a, and a first planar portion 312_2b disposed on the second base 312_2a. The fourth portion 314_2 may include a fourth base 314_2a, and a second planar portion 314_2b disposed on the fourth base 314_2a.

In more detail, the first protrusions 311_2b may be disposed on the first base 311_2a included in the first portion 311_2 of the functional layer 310_2, and may be spaced apart from each other. The second protrusions 313_2b may be disposed on the third base 313_2a included in the third portion 313_2 of the functional layer 310_2, and may be spaced apart from each other. In other words, each of the first portion 311_2 and the third portion 313_2 of the functional layer 310_2 may include a first area, in which the first protrusion 311_2b or the second protrusion 313_2b is disposed, and a second area, in which the first protrusion 311_2b and the second protrusion 313_2b are not disposed. The first and second areas may be alternately arranged with each other. Accordingly, each of the first portion 311_2 and the third portion 313_2 of the functional layer 310_2 may have an unevenness pattern on a surface thereof based on the absence and the presence of the first protrusion 311_2b or the second protrusion 313_2b.

Each of the first protrusion 311_2b and the second protrusion 313_2b may have a rectangular cross-sectional structure. In other words, each of both side faces of each of the first protrusion 311_2b and the second protrusion 313_2b may be perpendicular to or substantially perpendicular to the display panel 10. However, the present disclosure is not limited thereto. A cross-sectional shape of each of the first protrusion 311_2b and the second protrusion 313_2b may be formed, such that each of both side faces thereof may have a reversely tapered inclined face, a tapered inclined face, or a curved inclined face.

In FIG. 9, the shapes and sizes of the first protrusions 311_2b and the second protrusions 313_2b are shown to be the same or substantially the same with each other. However, the present disclosure is not limited thereto. In some embodiments, the shapes and sizes of the first protrusions 311_2b and the second protrusions 313_2b may be different from each other.

Further, FIG. 9 shows that the first protrusion 311_2b and the second protrusion 313_2b are formed integrally with the first base 311_2a of the first portion 311_2 and the third base 313_2a of the third portion 313_2, respectively, and include the same or substantially the same materials as those of the first base 311_2a of the first portion 311_2 and the third base 313_2a of the third portion 313_2, respectively. However, the present disclosure is not limited thereto. In some embodiments, the first base 311_2a and the third base 313_2a may be made of the same or substantially the same material as each other, and the first protrusion 311_2b and the second protrusion 313_2b may be made of the same or substantially the same material as each other, while the first protrusion 311_2b may be stacked on the first base 311_2a and the second protrusion 313_2b may be stacked on the third base 313_2a.

In FIG. 9, it is shown that a spacing by which the first protrusions 311_2b are spaced from each other along the first direction DR1 is equal to or substantially equal to a spacing by which the second protrusions 313_2b are spaced from each other along the first direction DR1, and widths in the first direction DR1 of the first protrusion 311_2b and the second protrusion 313_2b are equal to or substantially equal to each other. However, the present disclosure is not limited thereto. In some embodiments, the spacing by which the first protrusions 311_2b are spaced from each other along the first direction DR1 may be different from the spacing by which the second protrusions 313_2b are spaced from each other along the first direction DR1, and/or the widths in the first direction DR1 of the first protrusion 311_2b and the second protrusion 313_2b may be different from each other.

Further, FIG. 9 shows that the number of the second protrusions 313_2b included in the third portion 313_2 of the functional layer 310_2 is greater than the number of the first protrusions 311_2b included in the first portion 311_2 of the functional layer 310_2. However, the present disclosure is not limited thereto. In some embodiments, the number of the first protrusions 311_2b included in the first portion 311_2 may be equal to or greater than the number of the second protrusions 313_2b included in the third portion 313_2.

The first protrusion 311_2b and the second protrusion 313_2b may have the same or substantially the same vertical dimension as each other, and may protrude downwardly of the functional layer 310_2. A bottom face of each of the first protrusion 311_2b and the second protrusion 313_2b protruding downwardly of the functional layer 310_2 may be coplanar with a rear face of the second portion 312_2 of the functional layer 310_2. However, the present disclosure is not limited thereto. In some embodiments, the first protrusion 311_2b and the second protrusion 313_2b may have different vertical dimensions from each other. A vertical level of a bottom face of each of the first protrusion 311_2b and the second protrusion 313_2b may be higher or lower than a vertical level of the rear face of the second portion 312 of the functional layer 310_2.

Further, the second portion 312_2 of the functional layer 310_2 according to the present embodiment may include one side face adjacent to the first portion 311_2, and another side face opposite thereto and adjacent to the third portion 313_2. The one side face of the second portion 312_2 may face the first protrusion 311_2b included in the first portion 311_2, and the other side face thereof may face the second protrusion 313_2b included in the third portion 313_2.

According to the present embodiment, a sum of a dimension in the third direction DR3 of the first base 311_2a of the functional layer 310_2 and a dimension in the third direction DR3 of the first protrusion 311_2b thereof, a sum of a dimension in the third direction DR3 of the second base 312_2a of the functional layer 310_2 and a dimension in the third direction DR3 of the first planar portion 312_2b thereof, a sum of a dimension in the third direction DR3 of the third base 313_2a of the functional layer 310_2 and a dimension in the third direction DR3 of the second protrusion 313_2b thereof, and the sum of a dimension in the third direction DR3 of the fourth base 314_2a of the functional layer 310_2 and a dimension in the third direction DR3 of the second planar portion 314_2b thereof may be equal to or substantially equal to each other. However, the present disclosure is not limited thereto. In some embodiments, two or more of the sum of the dimension in the third direction DR3 of the first base 311_2a of the functional layer 310_2 and the dimension in the third direction DR3 of the first protrusion 311_2b thereof, the sum of the dimension in the third direction DR3 of the second base 312_2a of the functional layer 310_2 and the dimension in the third direction DR3 of the first planar portion 312_2b thereof, the sum of the dimension in the third direction DR3 of the third base 313_2a of the functional layer 310_2 and the dimension in the third direction DR3 of the second protrusion 313_2b thereof, and the sum of the dimension in the third direction DR3 of the fourth base 314_2a of the functional layer 310_2 and the dimension in the third direction DR3 of the second planar portion 314_2b thereof may be equal to each other, or may be different from each other.

FIG. 10 and FIG. 11 are perspective views showing the third portion 313_2 of the functional layer 310_2 of FIG. 9, according to various embodiments. For convenience of illustration, FIGS. 10 and 11 show only the third portion 313_2 of the functional layer 310_2. However, the first portion 311_2 of the functional layer 310_2 may have the same or substantially the same structure as that of the third portion 313_2 of the functional layer 310_2 shown in FIGS. 10 and 11, and thus, redundant description thereof may not be repeated.

Referring to FIG. 10, the plurality of second protrusions 313_2b disposed on the third base 313_2a of the third portion 313_2 of the functional layer 310_2 may be spaced apart from each other by a suitable distance (e.g., a predetermined distance) along the first direction DR1 and the second direction DR2 in a plan view, and may be arranged in a matrix manner in a plan view.

Referring to FIG. 11, each of the plurality of second protrusions 313_2b disposed on the third base 313_2a of the third portion 313_2 of the functional layer 310_2 may extend along the first direction DR1 in a line shape, while the plurality of second protrusions 313_2b may be spaced apart from each other by suitable spacings (e.g., predefined or predetermined spacings) in the second direction DR2. As shown in FIG. 11, widths in the second direction DR2 of the second protrusions 313_2b in the plan view may be equal to or substantially equal to each other. However, the present disclosure is not limited thereto. The third protrusions 313_2b may be spaced apart from each other in the second direction DR2 by different spacings from one another, or the widths in the second direction DR2 of the third protrusions 313_2b may be different from each other.

In the display device 1_2 according to the embodiment shown in FIG. 9, each of the first portion 311_2 and the third portion 313_2 of the functional layer 310_2 may have the surface unevenness depending on the absence and the presence of the first protrusion 311_2b or the second protrusion 313_2b. Thus, impact resistance of the functional layer 310_2 may be improved via air cushioning in an area where each of the first protrusion 311_2b and the second protrusion 313_2b is not disposed. Because a surface area size in contact with air in the area where each of the first protrusion 311_2b and the second protrusion 313_2b is not disposed may be increased, heat generated from the display panel 10 may be easily transferred to the outside through the area where each of the first protrusion 311_2b and the second protrusion 313_2b is not disposed.

Therefore, the functional layer 310_2 included in the display device 1_2 according to the present embodiment may concurrently (e.g., simultaneously) perform the light-blocking function, the impact resistance improvement function, and the heat dissipation function. Thus, a process of disposing the heat-dissipation layer 320 shown in FIG. 5 may be omitted, such that efficiency of a process of manufacturing the cover panel 300_2 may be improved.

Figure 12:
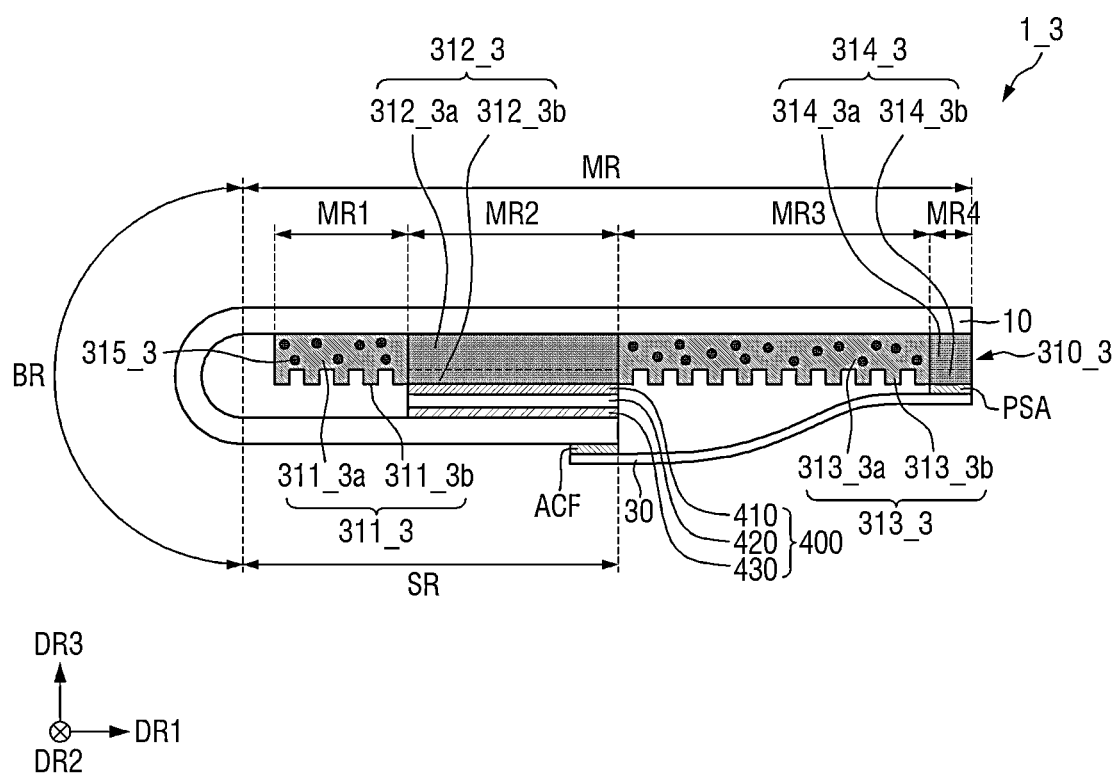
FIG. 12 is a schematic cross-sectional view of a display device according to another embodiment.

FIG. 12 is a schematic cross-sectional view of a display device according to another embodiment.

Referring to FIG. 12, a display device 1_3 according to another embodiment may further include a plurality of elastomer particles 315_3 in a first portion 311_3 and a third portion 313_3 of a functional layer 310_3, which may be different from the display device 1_2 according to FIG. 9.

In more detail, the plurality of elastomer particles 315_3 may be dispersed in the first portion 311_3 and the third portion 313_3 of the functional layer 310_3.

The plurality of elastomer particles 315_3 included in the functional layer 310_3 may be the same or substantially the same as the elastomer particles 315_1 described above with reference to FIG. 7. Accordingly, redundant description thereof may not be repeated. However, the present disclosure is not limited thereto. In some embodiments, the functional layer 310_3 may include the hollow particles 316_1 described above with reference to FIG. 8.

Therefore, the functional layer 310_3 included in the display device 1_3 according to the present embodiment may concurrently (e.g., simultaneously) perform the light-blocking function, the impact resistance improvement function, and the heat dissipation function, similar to the display device 1_2 according to FIG. 9. Thus, a process of placing the heat-dissipation layer 320 (e.g., refer to FIG. 5) may be omitted, such that efficiency of a process of manufacturing the cover panel 300_2 may be improved. Each of the first portion 311_3 and the third portion 313_3 of the functional layer 310_3 may include the plurality of elastomer particles 315_3 and/or the plurality of hollow particles 316_1 (e.g., see FIG. 8). Thus, impact resistance of each of the first portion 311_3 and the third portion 313_3 of the functional layer 310_3 may be improved to effectively protect the display panel 10.

Hereinafter, referring to FIG. 13 through FIG. 24, a method for manufacturing the display device will be described in more detail.

Figure 13:
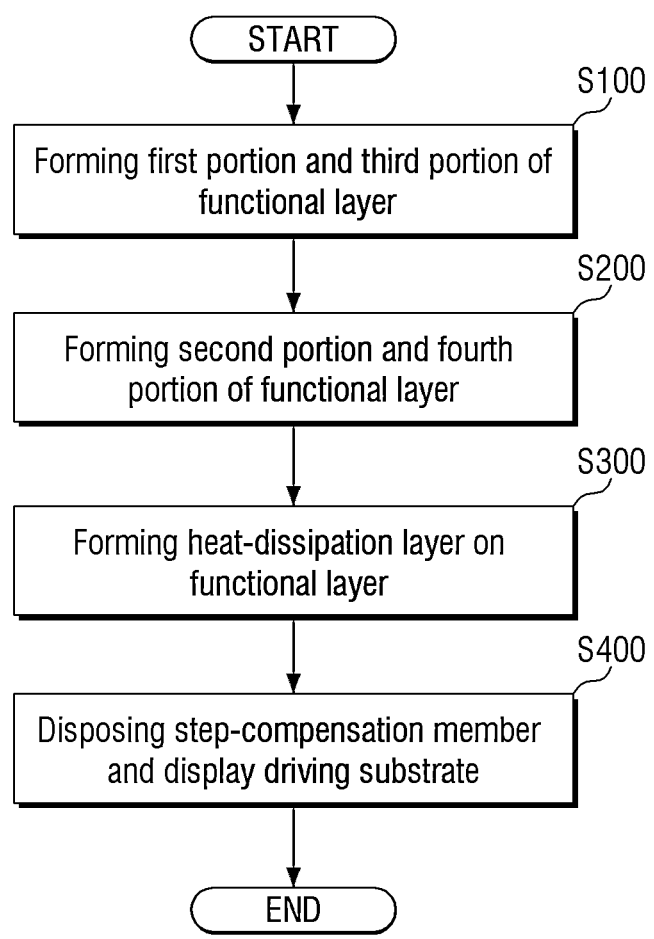
FIG. 13 is a flowchart illustrating a method for manufacturing a display device according to an embodiment.

FIG. 13 is a flowchart of a method for manufacturing a display device according to an embodiment. FIG. 14 through FIG. 19 are cross-sectional views illustrating structures corresponding to various processes of a method for manufacturing a display device according to an embodiment.

Referring to FIG. 13, a method for manufacturing the display device 1 according to an embodiment may include a process S100 of forming the first portion 311 and the third portion 313 of the functional layer 310. The first portion 311 may be formed on the rear face of the first main area MR1 of the display panel 10 and the third portion 313 may be formed on the rear face of the third main area MR3 of the display panel 10. The method may further include a process S200 of forming the second portion 312 and the fourth portion 314 of the functional layer 310. The second portion 312 may be formed on the rear face of the second main area MR2 of the display panel 10, and the fourth portion 314 may be formed on the rear face of the fourth main area MR4 of the display panel 10. The method may further include a process S300 of forming the heat-dissipation layer 320 on the functional layer 310. The heat-dissipation layer 320 may be formed on the rear face of each of the first portion 311, the second portion 312, the third portion 313, and the fourth portion 314 of the functional layer 310. The method may further include a process S400 of disposing the step-compensation member 400 and the display driving substrate 30.

The method for manufacturing the display device 1 is not limited to the above example. At least some of the processes may be omitted, or at least one further process may be further included therein with reference to the various embodiments of the present disclosure.

Hereinafter, the method for manufacturing the display device will be described in more detail with reference to FIG. 14 through FIG. 19.

Figure 14:
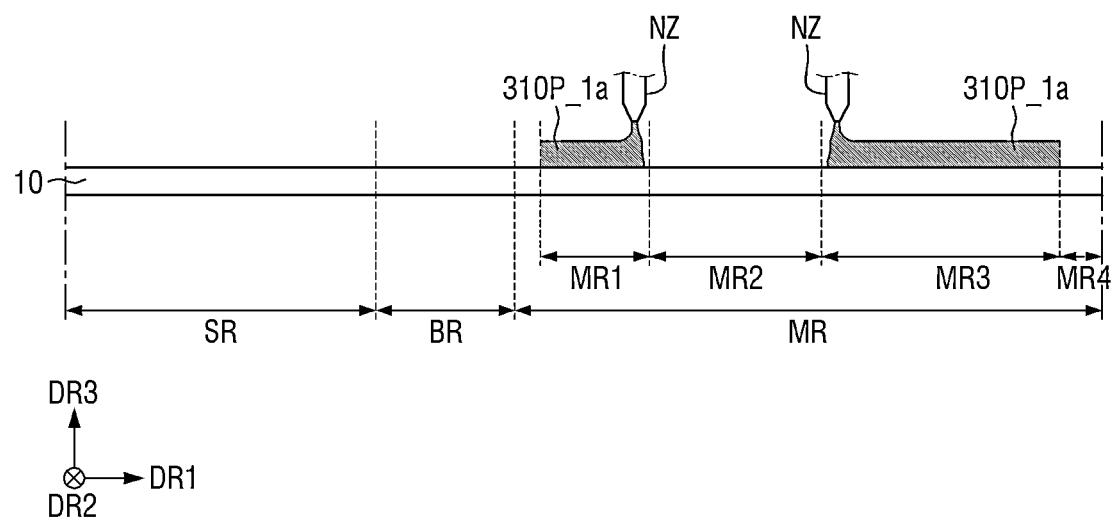
FIGS. 14-19 are cross-sectional views illustrating structures corresponding to various processes of a method for manufacturing a display device according to an embodiment.

Referring to FIG. 14, the process S100 of forming the first portion 311 and the third portion 313 of the functional layer 310 may further include a process of preparing the display panel 10. In order to stack the components on the rear face of the display panel 10 in a state in which the display panel 10 is not bent, the manufacturing process may be performed in a state in which the display panel 10 has been rotated by 180 degrees (e.g., flipped over). In other words, the display panel 10 in a state in which the display panel 10 is not bent may be rotated by 180 degrees, so that the front face of the display panel 10 faces downwards and the rear face of the display panel 10 faces upwards.

A first organic material 310P_1a, which may be in a solution form containing the oligomer and/or the monomer, the light absorption material, the accelerator, and the reducing agent, is applied on an area corresponding to each of the first area MR1 and the third area MR3 of the display panel 10. Although FIG. 14 illustrates that the applying of the first organic material 310P_1a includes applying the first organic material 310P_1a through a nozzle NZ, the present disclosure is not limited thereto. For example, the first organic material 310P_1a may be applied in a suitable scheme, such as a jetting method, a slit coating method, a knife coating method, a spin coating method, a casting method, a micro gravure coating method, a gravure coating method, a bar coating method, a roll coating method, and/or the like.

Figure 15:
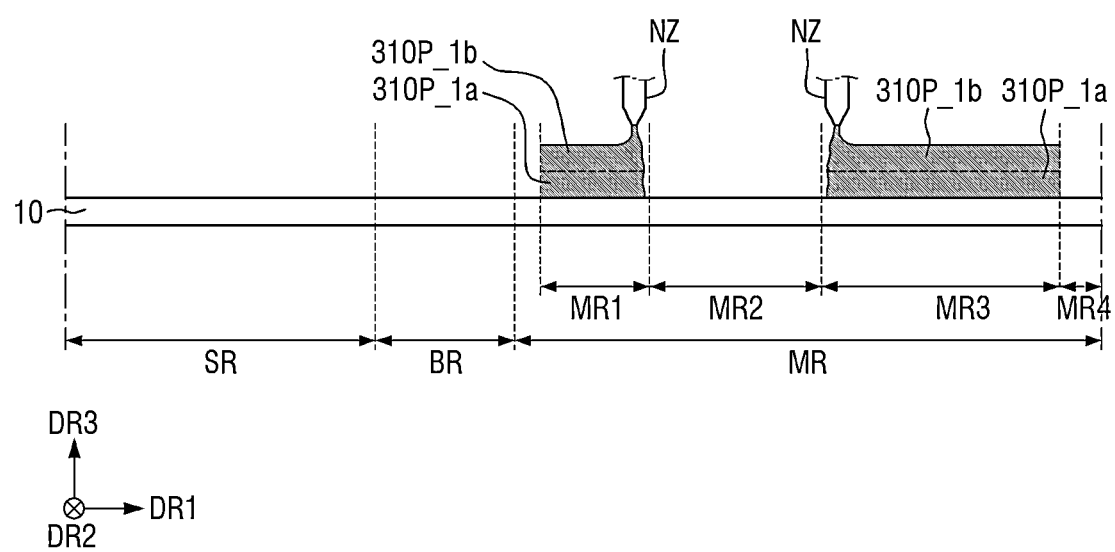

Then, referring to FIG. 15, a second organic material 310P_1b, which may be in a solution form containing the oligomer and/or the monomer, the light absorption material, and the peroxide, is applied on the first organic material 310P_1a applied to the area corresponding to each of the first main area MR1 and the third main area MR3 of the display panel 10 in the same or substantially the same application manner as that of the first organic material 310P_1a (e.g., through the nozzle NZ). Thus, the reducing agent contained in the first organic material 310P_1a and the peroxide contained in the second organic material 310P_2a react with each other to generate radicals to cause the acrylic curing reaction to occur. The curing reaction may be accelerated due to the additives contained in the first organic material 310P_1a and/or the second organic material 310P_1b.

Figure 16:
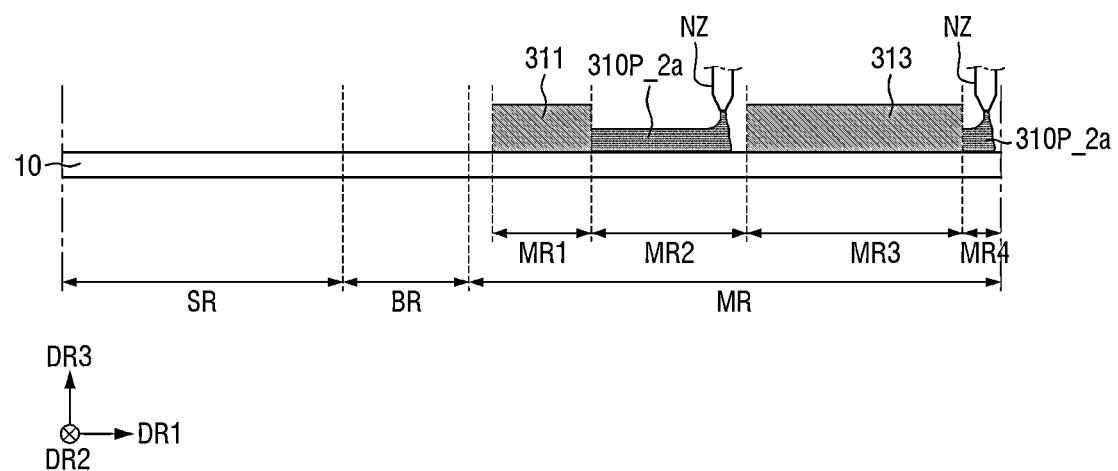

In other words, crosslinking between the oligomers and/or the monomers contained in each of the first organic material 310P_1a and the second organic material 310P_1b may occur, and thus, polymer chains may be formed. Thus, the curing proceeds. As shown in FIG. 16, the first portion 311 and the third portion 313 of the functional layer 310 may be formed at (e.g., in or on) the first main area MR1 and the third main area MR3 of the display panel 10, respectively.

However, the application order of the first organic material 310P_1a and the second organic material 310P_1b is not limited thereto. In other words, the second organic material 310P_1b may be first coated on each of the first main area MR1 and the third main area MR3 of the display panel 10, and then the first organic material 310P_1a may be coated on the second organic material 310P_1b.

In some embodiments, the first organic material 310P_1a and/or the second organic material 310P_1b may further include the elastomer particles 315_1 described above with reference to FIG. 7, and/or the hollow particles 316_1 described above with reference to FIG. 8.

Figure 17:
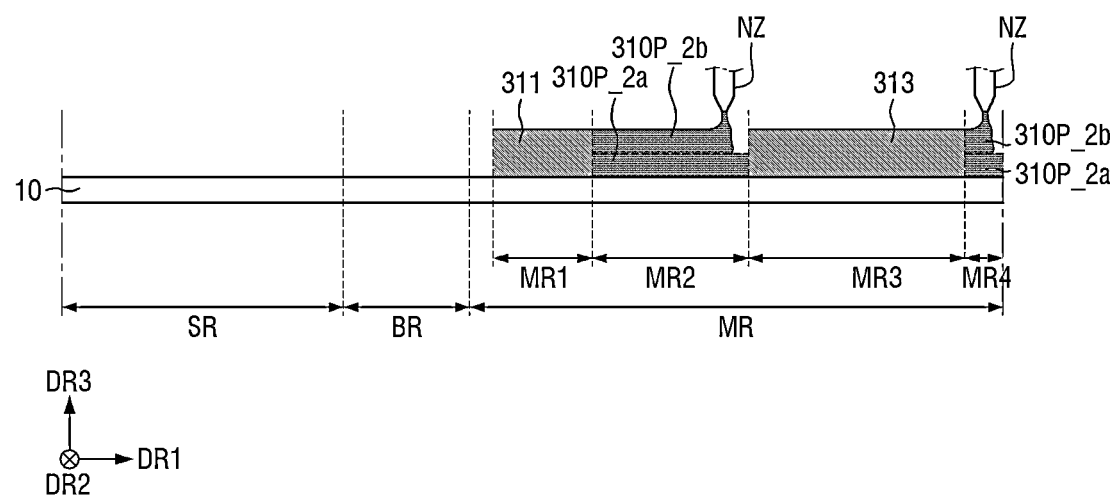

Then, referring to FIG. 16 and FIG. 17, after the first portion 311 and the third portion 313 of the functional layer 310 have been formed, a third organic material 310P_2a and a fourth organic material 310P_2b are sequentially applied to an area corresponding to each of the second main area MR2 and the fourth main area MR4 of the display panel 10. In other words, the third organic material 310P_2a may be applied at (e.g., in or on) each of the second main area MR2 and the fourth main area MR4 on the display panel 10, and then the fourth organic material 310P_2b may be applied onto the third organic material 310P_2a, which may be in the same or substantially the same manner as the sequential application manner of the first organic material 310P_1a and the second organic material 310P_1b at (e.g., in or on) each of the first main area MR1 and the third main area MR3 on the display panel 10.

However, the application order of the third organic material 310P_2a and the fourth organic material 310P_2b is not limited thereto. In other words, the fourth organic material 310P_2b may be first applied at (e.g., in or on) each of the second main area MR2 and the fourth main area MR4 on the display panel 10, and then the third organic material 310P_2a may be coated on the fourth organic material 310P_2b.

As described above, the third organic material 310P_2a and the fourth organic material 310P_2b may be sequentially applied at (e.g., in or on) each of the second main area MR2 and the fourth main area MR4 on the display panel 10. Thus, the second portion 312 and the fourth portion 314 of the functional layer 310 having higher hardness than that of each of the first portion 311 and the third portion 313 of the functional layer 310 may be formed. In this regard, each of the third organic material 310P_2a and the first organic material 310P_1a includes the oligomer and/or the monomer, the light absorbing material, the accelerator, and the reducing agent, such that the compositions and the contents of the oligomers and/or the monomers of the third organic material 310P_2a and the first organic material 310P_1a are different from each other. Each of the fourth material 310P_2b and the second organic material 310P_1b includes the oligomer and/or the monomer, the light absorbing material, and the peroxide, such that the compositions and the contents of the oligomers and/or the monomers of the fourth material 310P_2b and the second organic material 310P_1b are different from each other.

Accordingly, the organic materials in the solution state may be directly applied and cured. Thus, an insufficient curing phenomenon, which is based on a thickness of the layer such that only a surface of the layer is cured and a deep portion of the layer is not cured, may be prevented or substantially prevented. For example, such an insufficient curing phenomenon may occur in a UV based curing manner. Thus, reliability of the display device 1 may be improved. Further, a UV curing process may be omitted, such that efficiency of a process may be improved.

Figure 18:
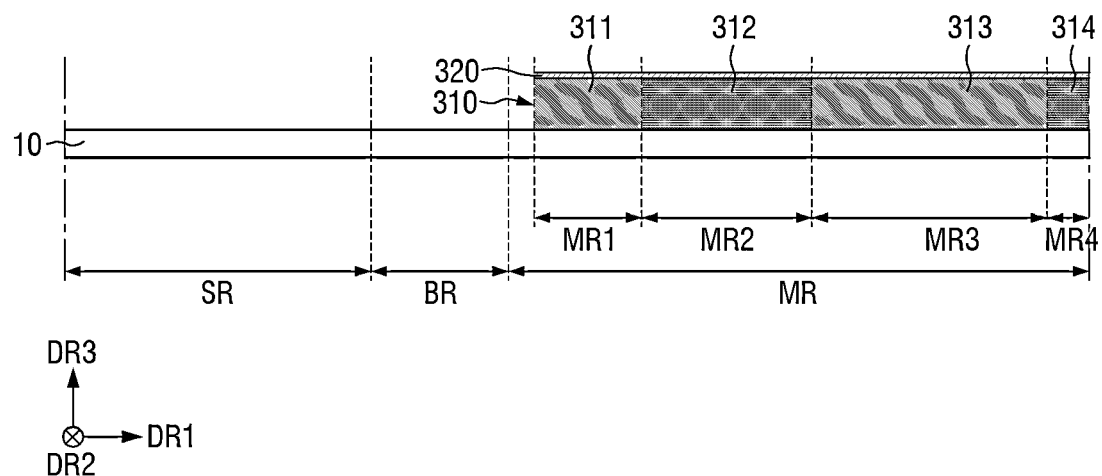

Then, referring to FIG. 18, in the process S300 of forming the heat-dissipation layer 320 on the rear face of each of the first portion 311, the second portion 312, the third portion 313, and the fourth portion 314 of the functional layer 310, the heat-dissipation layer 320 is formed on the functional layer 310 formed at (e.g., in or on) the main area MR on the display panel 10.

The first portion 311, the second portion 312, the third portion 313, and the fourth portion 314 of the functional layer 310 are formed by applying the organic materials in a solution state, and curing the applied materials via a curing reaction after a suitable amount of time (e.g., a predetermined amount of time) has elapsed. Thus, a surface of each of the first portion 311, the second portion 312, the third portion 313, and the fourth portion 314 of the functional layer 310 on which the heat-dissipation layer 320 is disposed may maintain or substantially maintain adhesion in a semi-cured state for a suitable time duration (e.g., a predetermined time duration).

Accordingly, the heat-dissipation layer 320 may be bonded to the first portion 311, the second portion 312, the third portion 313, and the fourth portion 314 of the functional layer 310 without an adhesive. After the heat-dissipation layer 320 has been disposed, the curing of the organic materials constituting the first portion 311, the second portion 312, the third portion 313, and the fourth portion 314 of the functional layer 310 has been completed.

Figure 19:
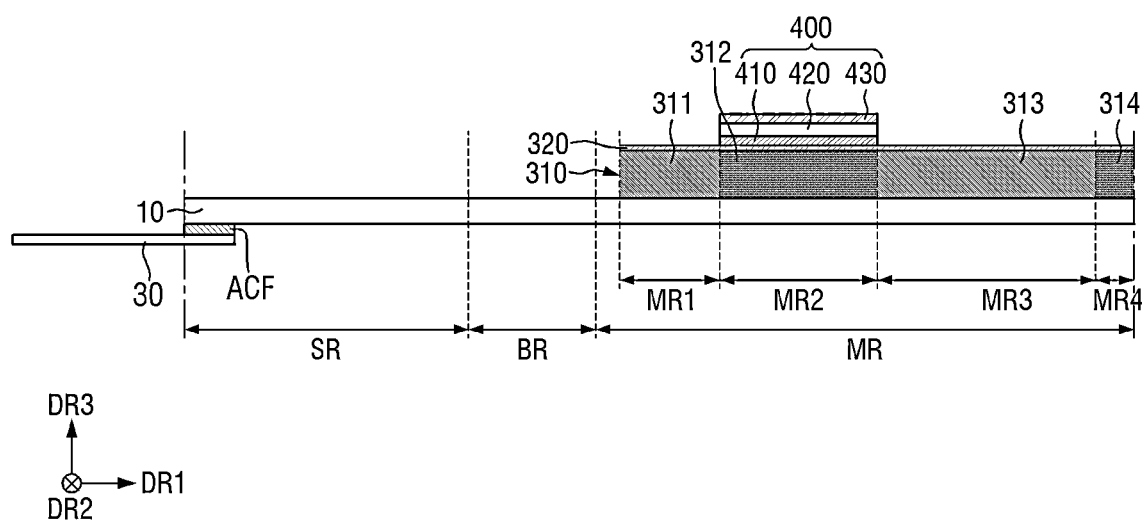

Then, referring to FIG. 19, in the process S400 of disposing the step-compensation member 400 and the display driving substrate 30, the step-compensation member 400 is formed on the rear face of the second portion 312 of the functional layer 310, and the display driving substrate 30 is formed on the display panel at (e.g., in or on) the sub-area SR.

In other words, the first adhesive member 410, the base member 420, and the second adhesive member 420 are sequentially stacked on the second portion 312 of the functional layer 310.

In more detail, the first adhesive member 410 is disposed on, and is in direct contact with, a portion of the heat-dissipation layer 320 disposed on the second portion 312 of the functional layer 310. A rear face of the base member 420 is disposed on, and is in contact with, the first adhesive member 410. A front face of the base member 420 is disposed on, and is in direct contact with, the second adhesive member 430.

Next, the display driving substrate 30 is disposed on one face of the display panel 10 at (e.g., in or on) the sub-area SR. In other words, the display driving substrate 30 is brought into contact with the display panel 10 via the anisotropic conductive film ACF having adhesive properties, such that the display panel 10 and the display driving substrate 30 may be electrically connected to each other.

Subsequently, the bent area BR of the display panel 10 is bent to have a suitable radius of curvature (e.g., a predetermined radius of curvature).

Accordingly, a portion of the display panel 10 disposed at (e.g., in or on) the sub-area SR comes into contact with the second adhesive member 430 disposed on the second portion 312 of the functional layer 310, such that the step-compensation member 400 may be fixed to the rear face of the display panel 10, and the display driving substrate 30 positioned at (e.g., in or on) the sub-area SR may be in contact with, and fixed to, the fourth portion 314 of the functional layer 310.

Figure 20:
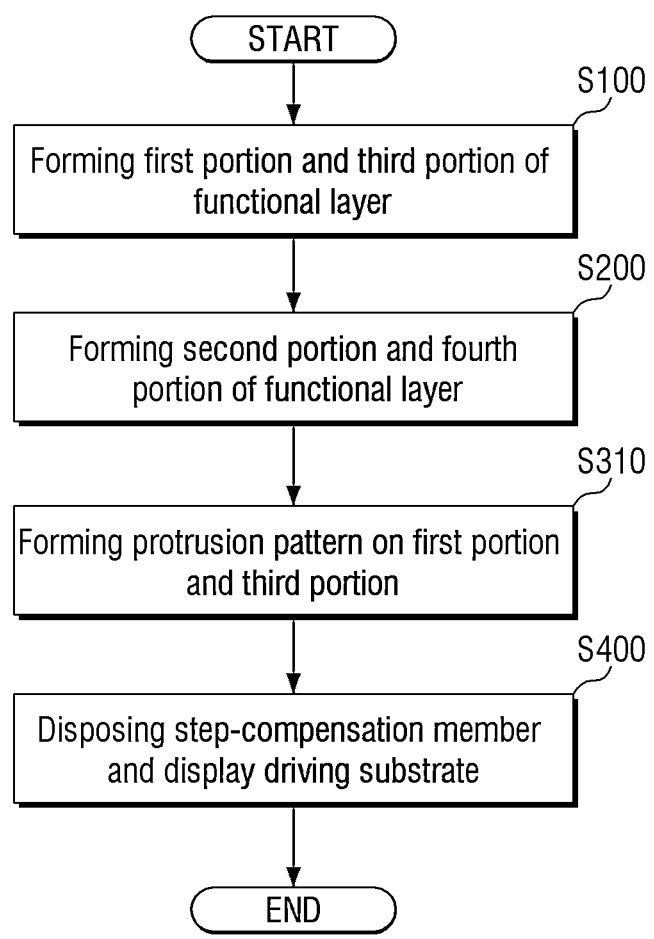
FIG. 20 is a flowchart illustrating a method for manufacturing a display device according to another embodiment.

FIG. 20 is a flowchart illustrating a method for manufacturing a display device according to another embodiment. FIG. 21 through FIG. 24 are cross-sectional views illustrating structures corresponding to various processes of a method for manufacturing a display device according to another embodiment.

Referring to FIG. 20, the present method may be different from the method for manufacturing display device 1 according to the embodiment described above with reference to FIG. 13, in that the process of forming the heat-dissipation layer 320 on the functional layer (e.g., S300 in FIG. 13) may be omitted, and the method may further include a process S310 of forming a protrusion pattern (e.g., an unevenness pattern) on the first portion 311_2 and the third portion 313_2 of the functional layer 310_2.

In an embodiment, the process S310 of forming the unevenness pattern on the first portion 311_2 and the third portion 313_2 of the functional layer 310_2 may be performed via a pattern transfer process. For example, the pattern transfer process may be embodied as an imprint method. However, the present disclosure is not limited thereto.

Hereinafter, a method for manufacturing a display device according to another embodiment will be described in more detail. In following embodiments, the same reference numerals as those of the embodiments described above may be applied to the same or substantially the same components as those of the embodiments described above, and thus, redundant description thereof may not be repeated or may be simplified.

Figure 21:
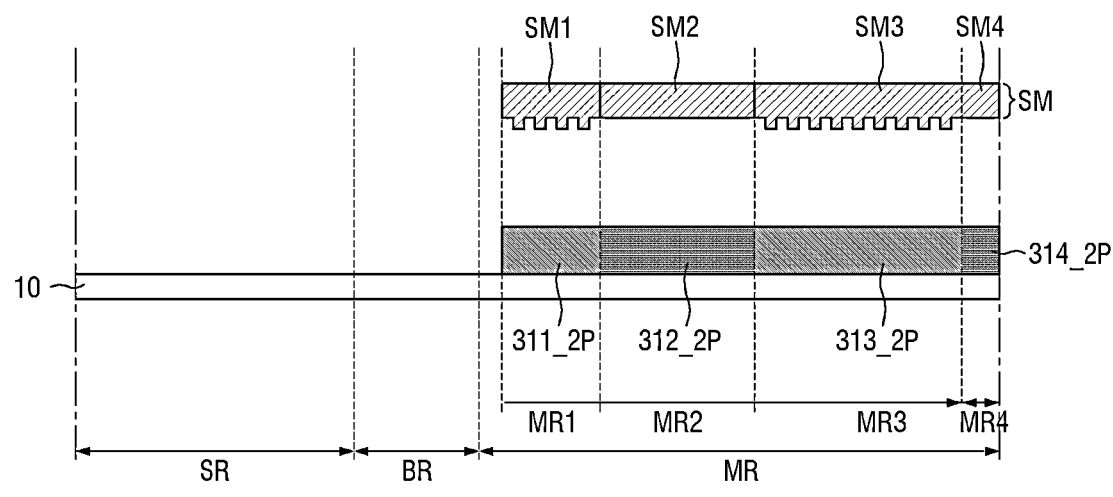
FIGS. 21-24 are cross-sectional views illustrating structures corresponding to various processes of a method for manufacturing a display device according to another embodiment.
Figure 21:
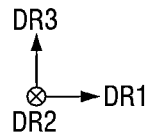

Referring to FIG. 21, in the process S310 of forming the unevenness pattern on the first portion 311_2 and the third portion 313_2 of the functional layer 310_2, the organic materials in a form of a solution are applied on the display panel 10 in a direct coating manner as described above. Then, a pre-functional layer including a first portion 311_2P, a second portion 312_2P, a third portion 313_2P, and a fourth portion 314_2P is formed via curing. Then, a mold SM on which the unevenness pattern is formed is placed above a top face of the pre-functional layer.

As shown in FIG. 21, the mold SM including the unevenness structure may include a first mold portion SM1, a second mold portion SM2, a third mold portion SM3, and a fourth mold portion SM4.

In more detail, the first mold portion SM1 and the third mold portion SM3 may correspond to the first portion 311_2P and the third portion 313_2P, respectively, of the pre-functional layer, and may have unevenness structures to form unevenness patterns on surfaces of the first portion 311_2P and the third portion 313_2P. The unevenness pattern is not formed on the second portion 312_2P and the fourth portion 314_2P of the pre-functional layer. Thus, the second mold portion SM2 and the fourth mold portion SM4 may have a flat or substantially flat surface without an unevenness structure, which is different from the first mold portion SM1 and the third mold portion SM3.

Figure 22:
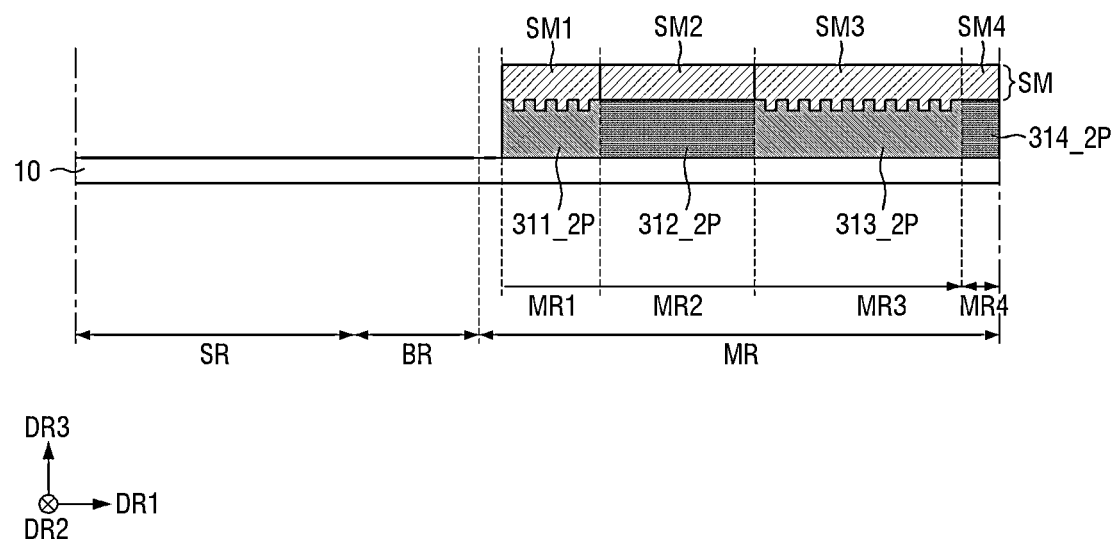

Then, as shown in FIG. 22, the mold SM is brought into contact with the pre-functional layer, and is pressed against the pre-functional layer. Thus, the unevenness pattern of the mold SM is transferred to the first portion 311_2P and the third portion 313_2P of the pre-functional layer.

Figure 23:
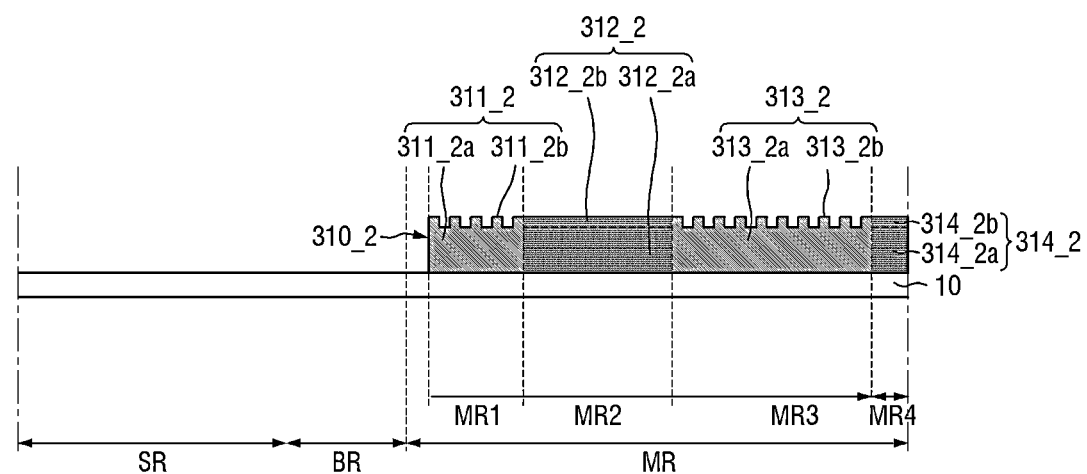
Figure 23:
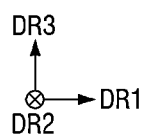

When the mold SM is removed from the pre-functional layer upwardly, the first protrusions 311_2b that are spaced apart from each other may be formed on the first base 311_2a included in the first portion 311_2 of the functional layer 310_2, and the second protrusions 313_2bs that are spaced apart from each other may be formed on the second base 313_2a included in the third portion 313_2 of the functional layer 310_2, as shown in FIG. 23. In other words, the unevenness pattern is formed on the surface of each of the first portion 311_2 and the third portion 313_2 of the functional layer 310_2.

Further, the first planar portion 312_2b and the second planar portion 314_2b are formed on the second base 312_2a of the second portion 312_2 of the functional layer 310_2 and the fourth base 314_2a of the fourth portion 314_2 in contact with the second mold portion SM2 and the fourth mold portion SM4 having no unevenness structure, respectively.

Figure 24:
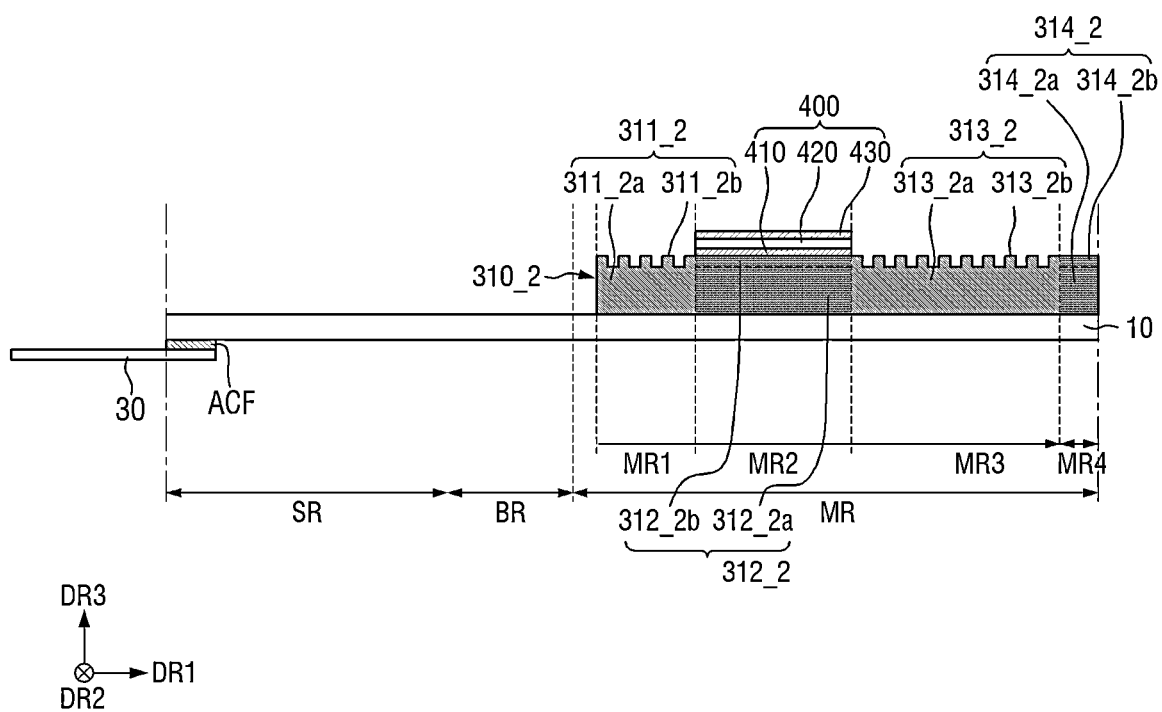

Next, referring to FIG. 24, the step-compensation member 400 is formed on the second portion 312_2 of the functional layer 310_2, and the display driving substrate 30 is placed on one face of a portion of the display panel 10 disposed at (e.g., in or on) the sub-area SR.

A process S400 of disposing the step-compensation member 400 and the display driving substrate 30 may be the same or substantially the same as the process S400 of disposing the step-compensation member 400 and the display driving substrate 30 described above with reference to FIG. 19, and thus, redundant description thereof will not be repeated.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel having one face, and another face opposite to the one face, the display panel comprising a main area, a sub-area spaced from the main area, and a bent area between the main area and the sub-area;
a functional layer on the one face of the display panel, and comprising a light-blocking material; and
a display driving substrate on the other face of the display panel, and electrically connected to the display panel;
wherein the functional layer comprises a first portion spaced from the sub-area and coupled with the display driving substrate and the main area, and a second portion spaced from the display driving substrate, and
wherein a hardness of the first portion is greater than a hardness of the second portion.

2. The device of claim 1, wherein the main area is in contact with the functional layer,
wherein the sub-area faces away from the main area, and is spaced from the functional layer,
wherein the display panel is bent at the bent area,
wherein the display device further comprises a step-compensation member between the functional layer and the sub-area of the display panel, and in contact with the functional layer and the sub-area of the display panel,
wherein the functional layer further comprises a third portion contacting the step-compensation member, and a fourth portion spaced from the step-compensation member, and
wherein a hardness of the third portion is greater than the hardness of the second portion and a hardness of the fourth portion.

3. The device of claim 2, wherein the third portion is spaced from the first portion with the second portion interposed therebetween, and
wherein the fourth portion is spaced from the second portion with the third portion interposed therebetween.

4. The device of claim 2, further comprising:
a heat-dissipation layer between the functional layer and the step-compensation member.

5. The device of claim 4, wherein the step-compensation member comprises:
a first adhesive member;
a second adhesive member; and
a base member between the first adhesive member and the second adhesive member, and
wherein the first adhesive member is in contact with the heat-dissipation layer, while the second adhesive member is in contact with the sub-area of the display panel.

6. The device of claim 2, wherein each of the second portion and the fourth portion comprises elastomer particles including a light-blocking material, and/or hollow particles including a light-blocking material.

7. The device of claim 6, wherein a diameter of each of the elastomer particles and/or the hollow particles is in a range of 100 nm to 5 μm.

8. The device of claim 6, wherein each of the elastomer particles and/or the hollow particles does not overlap with the step-compensation member.

9. The device of claim 1, wherein the functional layer has a thickness in a range of 20 μm to 140 μm.

10. The device of claim 2, wherein each of the first portion, the second portion, the third portion, and the fourth portion comprises at least one organic material from among a (meth)acrylate-based organic material or a monofunctional (meth)acrylate-based organic material, and
wherein a composition of the organic material contained in each of the first portion and the third portion is different from a composition of the organic material contained in each of the second portion and the fourth portion.

11. A display device comprising:
a display panel having one face, and another face opposite to the one face; and
a functional layer on the one face of the display panel, and comprising a light-blocking material;
wherein the functional layer comprises:
a first portion having a first base, and at least two first protrusions on the first base;
a second portion having a second base, and a planar portion on the second base; and
a third portion having a third base, and at least two second protrusions on the third base,
wherein the first protrusions are spaced from each other,
wherein the second protrusions are spaced from each other, and
wherein a hardness of the second portion is greater than a hardness of the first portion and a hardness of the third portion.

12. The device of claim 11, wherein the planar portion includes one side face adjacent to the first portion, and another side face opposite the one side face and adjacent to the third portion,
wherein the one side face of the planar portion faces a first protrusion from among the at least two first protrusions, and
wherein the other side face of the planar portion faces a second protrusion from among the at least two second protrusions.

13. The device of claim 11, wherein the first base and the first protrusions are integral with each other,
wherein the second base and the planar portion are integral with each other, and
wherein the third base and the second protrusions are integral with each other.

14. The device of claim 11, wherein at least two of a sum of a dimension in a thickness direction of the first base and a dimension in the thickness direction of a first protrusion from among the first protrusions, a sum of a dimension in the thickness direction of the second base and a dimension in the thickness direction of the planar portion, and a sum of a dimension in the thickness direction of the third base and a dimension in the thickness direction of a second protrusion from among the second protrusions are equal to each other.

15. The device of claim 11, further comprising:
a step-compensation member comprising:
a first adhesive member;
a second adhesive member; and
a base member between the first adhesive member and the second adhesive member,
wherein the step-compensation member is on one face of the second portion, and
wherein the step-compensation member overlaps with the second portion in a thickness direction of the display device.

16. The device of claim 15, wherein each of the first portion and the third portion comprises elastomer particles including a light-blocking material, and/or hollow particles including a light-blocking material.

17. The device of claim 11, wherein each of the first protrusions and the second protrusions protrudes in a direction away from the one face of the display panel.

18. The device of claim 11, wherein an optical density of the functional layer is in a range of 3 to 4.

19. A method for manufacturing a display device, the method comprising:
   providing a display panel having a first area, a second area, a third area between the first area and the second area, and a fourth area spaced from the third area with the second area therebetween;
   applying a first organic material comprising peroxide on the first area and the second area, and applying a second organic material comprising a reducing agent on the first organic material to form a first portion and a second portion of a functional layer by mixing and a curing reaction between the first organic material and the second organic material; and
   applying a third organic material comprising peroxide on the third area and the fourth area, and applying a fourth organic material containing a reducing agent on the third organic material to form a third portion and a fourth portion of the functional layer by mixing and a curing reaction between the third organic material and the fourth organic material,
   wherein the third organic material has a different composition from a composition of the first organic material, and the fourth organic material has a different composition from a composition of the second organic material, and
   wherein each of the first organic material, the second organic material, the third organic material, and the fourth organic material comprises at least one organic material from among a (meth)acrylate-based organic material or a monofunctional (meth)acrylate-based organic material.

20. The method of claim 19, further comprising:
   forming protrusions on each of the first portion and the second portion.

* * * * *